(12) United States Patent
Yang et al.

(10) Patent No.: US 11,762,521 B2
(45) Date of Patent: Sep. 19, 2023

(54) DISPLAY DEVICE AND A METHOD OF FABRICATING THE SAME

(71) Applicant: Samsung Display Co., Ltd., Yongin-Si (KR)

(72) Inventors: Sung-Jin Yang, Cheonan-si (KR); Hyunsik Park, Cheonan-si (KR); Chungi You, Asan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 22 days.

(21) Appl. No.: 17/672,966

(22) Filed: Feb. 16, 2022

(65) Prior Publication Data

US 2022/0171501 A1 Jun. 2, 2022

Related U.S. Application Data

(63) Continuation of application No. 17/015,297, filed on Sep. 9, 2020, now Pat. No. 11,256,379.

(30) Foreign Application Priority Data

Sep. 26, 2019 (KR) .......................... 10-2019-0118541
Mar. 18, 2020 (KR) .......................... 10-2020-0032994

(51) Int. Cl.
*G06F 3/044* (2006.01)
(52) U.S. Cl.
CPC .. *G06F 3/0446* (2019.05); *G06F 2203/04103* (2013.01); *G06F 2203/04111* (2013.01)

(58) Field of Classification Search
CPC ......... G06F 3/0446; G06F 2203/04103; G06F 2203/04111; G06F 3/0443; G06F 3/0412;
(Continued)

(56) References Cited

U.S. PATENT DOCUMENTS 6,373,544 B1 * 4/2002 Hirabayashi ............ H01L 27/12
349/149
7,875,880 B2 * 1/2011 Lee ........................ H10K 59/88
257/E51.019

(Continued)

FOREIGN PATENT DOCUMENTS

KR 10-2005-0031594 4/2005
KR 10-0916607 9/2009
(Continued)

*Primary Examiner* — Amy Onyekaba
(74) *Attorney, Agent, or Firm* — F. Chau & Associates, LLC

(57) ABSTRACT

A display device including: a display panel; and an input sensor disposed on the display panel, wherein the input sensor includes: sensing electrodes; signal lines connected to the sensing electrodes; a first insulating layer; a second insulating layer disposed on the first insulating layer; and first, second and third test patterns having different stacking structures from each other, wherein the first test pattern include a first conductive pattern, a first insulating pattern overlapping the first conductive pattern, and a second insulating pattern overlapping the first insulating pattern, the second test pattern includes a third insulating pattern and a fourth insulating pattern overlapping the third insulating pattern, and
the third test pattern includes a second conductive pattern.

20 Claims, 22 Drawing Sheets

(58) Field of Classification Search
CPC .............. G06F 3/044; H01L 27/3276; H01L 2227/323; H01L 27/323; H01L 27/3244; H01L 22/30; H01L 22/34
See application file for complete search history.

(56) References Cited

U.S. PATENT DOCUMENTS

| | | | | |
|---|---|---|---|---|
| 9,535,549 | B2* | 1/2017 | Pyoun | G06F 3/0445 |
| 9,537,482 | B2* | 1/2017 | Huh | G06F 3/0443 |
| 11,011,438 | B2* | 5/2021 | Ko | H01L 27/1237 |
| 2008/0237585 | A1* | 10/2008 | Kim | H10K 59/1216 257/E27.113 |
| 2011/0057893 | A1* | 3/2011 | Kim | G06F 3/0412 345/173 |
| 2011/0057905 | A1* | 3/2011 | Yu | G06F 3/0445 345/174 |
| 2012/0062487 | A1* | 3/2012 | Lee | G06F 3/0443 345/173 |
| 2012/0153310 | A1* | 6/2012 | Kwak | G02F 1/134363 257/E21.531 |
| 2012/0268159 | A1* | 10/2012 | Cho | G11C 29/022 324/762.01 |
| 2013/0141714 | A1* | 6/2013 | Park | G03F 7/70133 356/121 |
| 2014/0027720 | A1* | 1/2014 | Kim | H10K 59/88 257/E51.001 |
| 2015/0188538 | A1* | 7/2015 | Huh | H03K 17/9622 349/12 |
| 2015/0268795 | A1* | 9/2015 | Kurasawa | G06F 3/0445 345/174 |
| 2016/0011108 | A1* | 1/2016 | Jeon | G09G 3/3648 356/445 |
| 2016/0020159 | A1* | 1/2016 | Su | H01L 22/34 257/48 |
| 2016/0049581 | A1* | 2/2016 | Kim | H10N 50/01 257/421 |
| 2016/0284771 | A1* | 9/2016 | Hwang | H10K 59/1213 |
| 2016/0322451 | A1* | 11/2016 | Park | H10K 71/70 |
| 2018/0026088 | A1* | 1/2018 | Oh | H10K 59/131 361/749 |
| 2018/0226467 | A1* | 8/2018 | Ka | H10K 59/12 |
| 2018/0233436 | A1* | 8/2018 | Lee | G02F 1/13452 |
| 2019/0004418 | A1* | 1/2019 | Jeong | G03F 1/36 |
| 2019/0029634 | A1* | 1/2019 | Ferng | G01T 1/243 |
| 2019/0035788 | A1* | 1/2019 | Kim | H01L 27/0924 |
| 2019/0057912 | A1* | 2/2019 | Liu | H01L 23/585 |
| 2019/0155417 | A1* | 5/2019 | Lee | G06F 3/0446 |
| 2019/0196661 | A1* | 6/2019 | Baek | G09G 3/3225 |
| 2019/0235691 | A1* | 8/2019 | Kim | G06F 3/0416 |
| 2019/0280075 | A1* | 9/2019 | Chung | H05K 1/189 |
| 2020/0012161 | A1* | 1/2020 | Yoshii | G02F 1/136286 |
| 2020/0044003 | A1* | 2/2020 | Cho | G09F 9/30 |
| 2020/0135755 | A1* | 4/2020 | Shin | H10B 43/27 |
| 2020/0212159 | A1* | 7/2020 | Lee | H10K 59/131 |
| 2021/0096694 | A1 | 4/2021 | Yang et al. | |
| 2021/0191553 | A1* | 6/2021 | Jang | G06F 3/0412 |

FOREIGN PATENT DOCUMENTS

| | | |
|---|---|---|
| KR | 10-1082293 | 11/2011 |
| KR | 10-2016-0052988 | 5/2016 |
| KR | 10-1670678 | 10/2016 |
| KR | 10-1935433 | 1/2019 |

* cited by examiner

DISPLAY DEVICE AND A METHOD OF FABRICATING THE SAME

CROSS-REFERENCE TO RELATED APPLICATIONS

This application is a continuation of U.S. patent application Ser. No. 17/015,297 filed on Sep. 9, 2020, which claims priority under 35 U.S.C. § 119 to Korean Patent Application No. 10-2019-0118541, filed on Sep. 26, 2019 and Korean Patent Application No. 10-2020-0032994, filed on Mar. 18, 2020, in the Korean Intellectual Property Office, the disclosures of which are incorporated by reference herein in their entireties.

TECHNICAL FIELD

The present inventive concept relates to a display device and a method of fabricating the same, and in particular, to a display device including an input sensor and a method of fabricating the same.

DISCUSSION OF RELATED ART

In general, a display device is an output device for presentation of information in visual form. Various display devices are being developed for use in multimedia devices, such as televisions, mobile phones, tablet computers, navigation systems, and gaming machines. A keyboard or a mouse may be used as an input device of the display device. In the case of a display device employing a touch screen, an input sensor, such as a touch panel, may be used as the input device of the display device.

A variety of failures may occur in a process of fabricating the display device. For example, a failure may occur in the input sensor.

SUMMARY

According to an exemplary embodiment of the inventive concept, a display device includes: a display panel; and an input sensor disposed on the display panel, wherein the input sensor includes: sensing electrodes; signal lines connected to the sensing electrodes; a first insulating layer; a second insulating layer disposed on the first insulating layer; and first, second and third test patterns having different stacking structures from each other, wherein the first test pattern includes a first conductive pattern, a first insulating pattern overlapping the first conductive pattern, and a second insulating pattern overlapping the first insulating pattern, the second test pattern includes a third insulating pattern and a fourth insulating pattern overlapping the third insulating pattern, and the third test pattern includes a second conductive pattern.

In an exemplary embodiment of the inventive concept, at least one of the first and second conductive patterns may include a transparent metal oxide, and one of the sensing electrodes may include an electrode pattern including a transparent metal oxide.

In an exemplary embodiment of the inventive concept, the first insulating layer and the first insulating pattern may include a same material, and the second insulating layer and the second insulating pattern may include a same material.

In an exemplary embodiment of the inventive concept, the first insulating layer and the first insulating pattern may be a single object, and the second insulating layer and the second insulating pattern may be a single object.

In an exemplary embodiment of the inventive concept, the first insulating layer, the first insulating pattern, and the third insulating pattern may be spaced apart from each other, when viewed in a plan view, and the second insulating layer, the second insulating pattern, and the fourth insulating pattern may be spaced apart from each other, when viewed in a plan view.

In an exemplary embodiment of the inventive concept, the display panel may include: a first substrate; a second substrate facing the first substrate; a circuit element layer disposed between the first substrate and the second substrate; and an emission element layer disposed on the circuit element layer.

In an exemplary embodiment of the inventive concept, a sensing electrode of the sensing electrodes and the first insulating layer may be in contact with a top surface of the second substrate.

In an exemplary embodiment of the inventive concept, the display panel may include an active region, on which pixels are disposed, and a peripheral region, which is adjacent to the active region, the sensing electrodes may include a first sensing electrode overlapped with the active region and a second sensing electrode crossing the first sensing electrode, the signal lines may include a first signal line connected to the first sensing electrode and a second signal line connected to the second sensing electrode.

In an exemplary embodiment of the inventive concept, the first sensing electrode may include a bridge pattern, a portion of which is disposed below the first insulating layer, and an electrode pattern, which is disposed on the first insulating layer and is connected to the portion of the bridge pattern disposed below the first insulating layer through a penetration hole penetrating the first insulating layer.

In an exemplary embodiment of the inventive concept, the input sensor may further include a pad electrode, the first signal line may include a line portion, which includes a same material as the portion of the bridge pattern disposed below the first insulating layer, and a pad portion, which is extended from an end of the line portion, and the pad electrode may be overlapped with the pad portion and include a same material as the electrode pattern.

In an exemplary embodiment of the inventive concept, the first signal line may overlap the peripheral region, and the first insulating layer may cover the line portion.

In an exemplary embodiment of the inventive concept, the portion of the bridge pattern, which is disposed below the first insulating layer, may include a metallic material, and the electrode pattern may include a transparent conductive oxide.

In an exemplary embodiment of the inventive concept, the first conductive pattern may be disposed between the first insulating pattern and the second insulating pattern, and the third test pattern may further include a fifth insulating pattern disposed below the second conductive pattern.

In an exemplary embodiment of the inventive concept, the test pattern may further include a fourth test pattern including a sixth insulating pattern.

In an exemplary embodiment of the inventive concept, the sixth insulating pattern may include a same material as the first insulating pattern.

In an exemplary embodiment of the inventive concept, the first sensing electrode may include an electrode pattern, which is disposed below the first insulating layer, and a bridge pattern, a portion of which is disposed on the first insulating layer, and which is connected to the electrode pattern through a penetration hole penetrating the first insulating layer.

In an exemplary embodiment of the inventive concept, the first signal line may include a line portion and a pad portion extended from an end of the line portion, the line portion may include a lower layer and an upper layer disposed on the lower layer, the upper layer may include a same material as the portion of the bridge pattern disposed on the first insulating layer, the pad portion may be extended from the lower layer, the pad portion may include a same material as the electrode pattern, and the pad portion may be exposed through the first insulating layer and the second insulating layer.

In an exemplary embodiment of the inventive concept, the first conductive pattern may be disposed below the first insulating pattern.

In an exemplary embodiment of the inventive concept, the display device may further include dummy patterns disposed in a vicinity of the test pattern, and the dummy patterns may include a same material as at least one of the first and second conductive patterns.

In an exemplary embodiment of the inventive concept, the display device may further include dummy patterns disposed near the test pattern, herein the dummy patterns and at least one of the first and second conductive patterns may be disposed on a same layer.

In an exemplary embodiment of the inventive concept, the test pattern may be disposed outside the signal lines.

According to an exemplary embodiment of the inventive concept, a display device may include: a display panel including a first glass substrate and a second glass substrate; and an input sensor disposed on a surface of the second glass substrate, wherein the input sensor includes: an insulating layer; a sensing electrode including a metal pattern and a first transparent metal oxide pattern, the first transparent metal oxide pattern being spaced apart from the metal pattern with the insulating layer interposed therebetween and being connected to the metal pattern through a penetration hole penetrating the insulating layer; and a test pattern, wherein the test pattern includes: a first test pattern including a second transparent metal oxide pattern, a first insulating pattern overlapped with the second transparent metal oxide pattern, and a second insulating pattern disposed on the first insulating pattern; a second test pattern including a third insulating pattern and a fourth insulating pattern disposed on the third insulating pattern; and a third test pattern including a third transparent metal oxide pattern, wherein one of the metal pattern and the first transparent metal oxide pattern is in contact with the surface of the second glass substrate.

According to an exemplary embodiment of the inventive concept, a method of fabricating a display device includes: etching a first substrate, on which an input sensor is disposed; combining the etched first substrate with a second substrate, on which an emission element is disposed, such that the input sensor is disposed outside the combined first and second substrates and the emission element is disposed between the combined first and second substrates; and etching the second substrate of the combined first and second substrates, wherein the input sensor includes: sensing electrodes; signal lines connected to the sensing electrodes; a first insulating layer; a second insulating layer disposed on the first insulating layer; and a test pattern, wherein the test pattern includes: a first test pattern including a first conductive pattern, a first insulating pattern overlapped with the first conductive pattern, and a second insulating pattern disposed on the first insulating pattern; a second test pattern including a third insulating pattern and a fourth insulating pattern disposed on the third insulating pattern; and a third test pattern including a second conductive pattern.

According to an exemplary embodiment of the inventive concept, a display device includes: a display panel including a first glass substrate and a second glass substrate; and an input sensor disposed on a surface of the second glass substrate, wherein the input sensor includes: a first insulating layer and a second insulating layer; a sensing electrode including a metal pattern and a transparent metal oxide pattern; and a test pattern, wherein the test pattern includes: a first test pattern including a first transparent metal oxide pattern, which is overlapped with a first region of the first insulating layer and a first region of the second insulating layer corresponding to the first region of the first insulating layer; a second test pattern including a second region of the first insulating layer and a second region of the second insulating layer corresponding to the second region of the first insulating layer; and a third test pattern including a second transparent metal oxide pattern.

BRIEF DESCRIPTION OF THE DRAWINGS

The above and other features of the inventive concept will become more apparent by describing in detail exemplary embodiments thereof with reference to the accompanying drawings.

DETAILED DESCRIPTION OF THE EMBODIMENTS

Figure 1A:
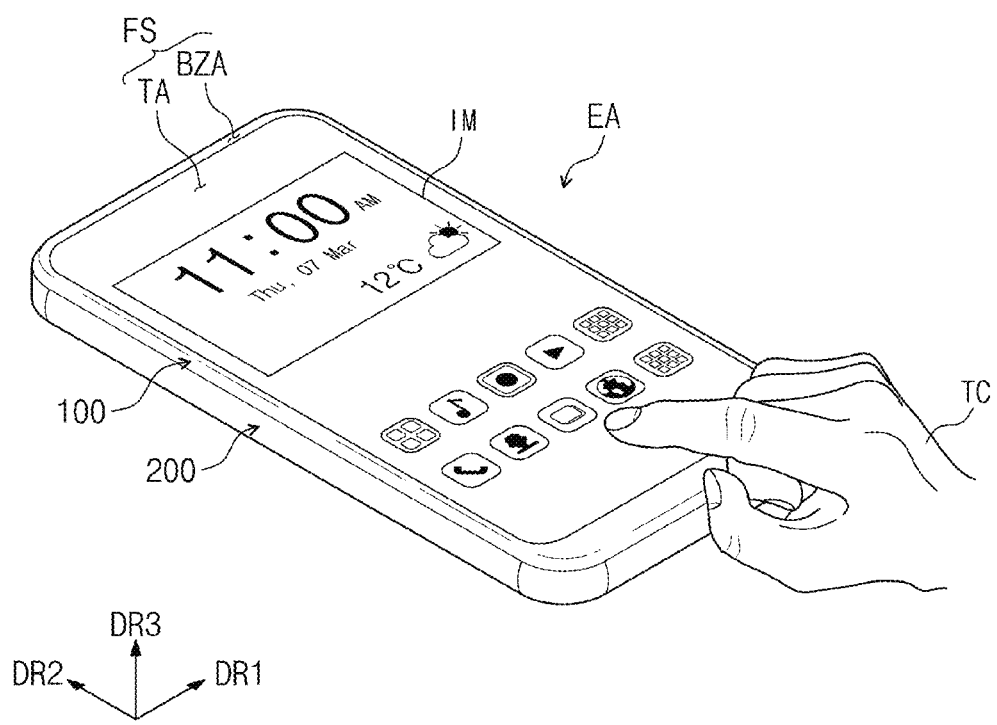
FIG. 1A is a perspective view illustrating a display device according to an exemplary embodiment of the inventive concept.

Exemplary embodiments of the inventive concept will now be described more fully with reference to the accompanying drawings. The inventive concept may, however, be embodied in many different forms and should not be construed as being limited to the embodiments set forth herein. In the drawings, the thicknesses of layers and regions may be exaggerated for clarity. Like reference numerals in the drawings may denote like elements, and thus their repetitive description may be omitted.

It will be understood that when an element is referred to as being "connected" or "coupled" to another element, it can be directly connected or coupled to the other element or intervening elements may be present. As used herein, the singular forms "a," "an" and "the" are intended to include the plural forms as well, unless the context clearly indicates otherwise. Exemplary embodiments of the inventive concept are described herein with reference to cross-sectional illustrations that are schematic illustrations of idealized examples (and intermediate structures) of the embodiments. As such, variations from the shapes of the illustrations as a result, for example, of manufacturing techniques and/or tolerances, are to be expected. Thus, the inventive concept should not be construed as limited to the particular shapes of regions illustrated herein but are to include deviations in shapes that result, for example, from manufacturing.

Figure 1B:
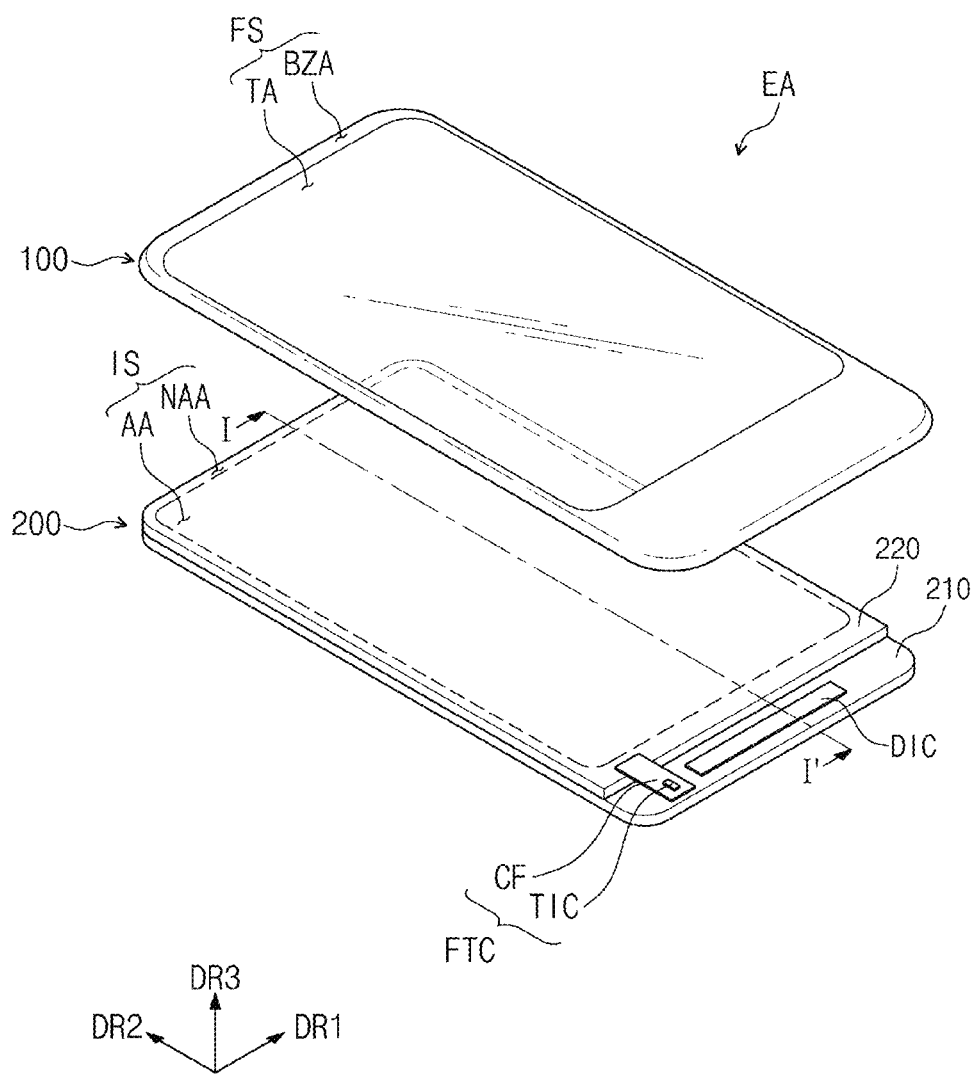
FIG. 1B is an exploded perspective view of the display device of FIG. 1A.
Figure 1C:
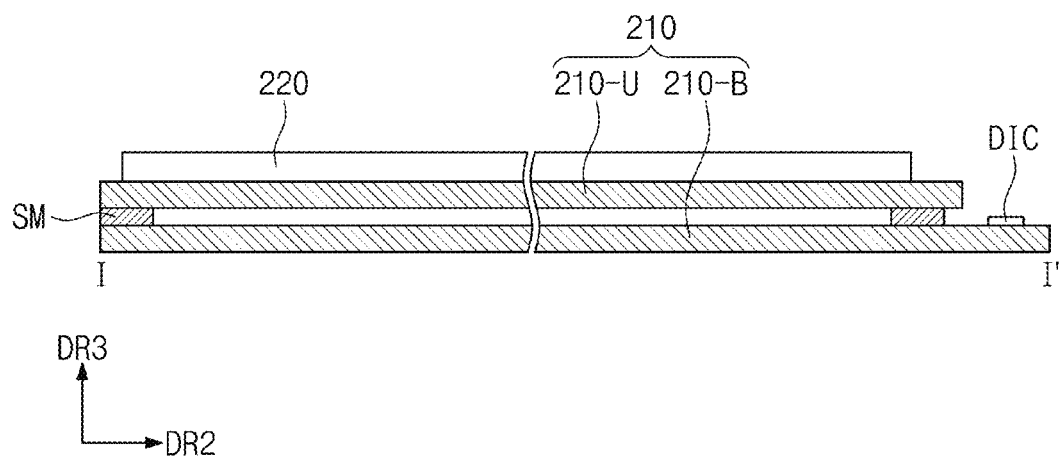
FIG. 1C is a sectional view taken along a line I-I' of FIG. 1B.

FIG. 1A is a perspective view illustrating a display device EA according to an exemplary embodiment of the inventive concept. FIG. 1B is an exploded perspective view of the display device EA of FIG. 1A. FIG. 1C is a sectional view taken along a line I-I' of FIG. 1B. Hereinafter, the display device EA according to the present embodiment will be described in more detail with reference to FIGS. 1A and 1B.

The display device EA may be selectively activated by an electrical signal applied thereto. The display device EA may be realized in various forms. For example, the display device EA may be one of tablets, notebooks, computers, smart televisions, and so forth. In the present embodiment, the display device EA may be a smart phone, as illustrated in FIG. 1A.

The display device EA may include a display surface FS for displaying an image IM. The display surface FS may be parallel to a surface defined by a first direction DR1 and a second direction DR2. A direction normal to the display surface FS (e.g., a thickness direction of the display device EA) will be referred to as a third direction DR3. Hereinafter, a front or top surface and a back or bottom surface of each element may be differentiated with respect to the third direction DR3. Hereinafter, the first to third directions DR1, DR2, and DR3 may be directions indicated by first to third direction axes, respectively, and the first to third direction axes will be identified with the same reference numbers as the first to third directions DR1, DR2 and DR3.

The display surface FS, on which the image IM is displayed, may correspond to the front surface of the display device EA and may correspond to a front surface FS of a window member 100. Hereinafter, the display surface (e.g., the front surface) of the display device EA and the front surface of the window member 100 may be indicated by using the same reference number, i.e., FS. As shown FIG. 1A, a clock icon and a plurality of application icons may be displayed as an example of the image IM.

The display device EA may include the window member 100 and an electronic panel 200. The display device EA may further include an optical member disposed between the window member 100 and the electronic panel 200. The optical member may include a polarizer. The optical member may include a color filter member for reducing reflectance of an external light.

The window member 100 may include a base panel. For example, the base panel may be formed of at least one of glass, plastic, or a combination thereof. The front surface FS of the window member 100 may include a transmission region TA and a bezel region BZA. The transmission region TA may be an optically transparent region. For example, the transmission region TA may be a region, whose transmittance to a visible light is about 90% or higher.

The bezel region BZA may be a region having a relatively low optical transmittance, compared with the transmission region TA. The bezel region BZA may demarcate the transmission region TA. The bezel region BZA may be adjacent to the transmission region TA and may enclose the transmission region TA. The window member 100 may further include a light-blocking pattern, which is disposed on the base panel to define the bezel region BZA.

The bezel region BZA may have a predetermined color. The bezel region BZA may cover a peripheral region NAA of the electronic panel 200 and may prevent the peripheral region NAA from being recognized by a user. However, the inventive concept is not limited to this example, and in an exemplary embodiment of the inventive concept, the bezel region BZA may be omitted from the window member 100.

The electronic panel 200 may display the image IM and may sense an external input TC. The image IM may be displayed on a front surface IS of the electronic panel 200. The front surface IS of the electronic panel 200 may include an active region AA and the peripheral region NAA. The active region AA may be a region, which is activated by an electrical signal applied thereto.

In the present embodiment, the active region AA may be a region, which is used to display the image IM and to sense the external input TC. The active region AA may correspond to the transmission region TA, and the peripheral region NAA may correspond to the bezel region BZA. In the present specification, the expression "a region or portion corresponds to another region or portion" may mean that the two regions or portions are overlapped with each other; however, they do not have to have the same area and/or the same shape.

The electronic panel 200 may include a display panel 210, an input sensor 220, a driving circuit DIC, and a circuit module FTC.

The display panel 210 may produce the image IM. The display panel 210 may be an organic light emitting display panel or a quantum dot light emitting display panel. The panels may be classified according to a material of an emission element used thereby. The emission layer of the organic light emitting display panel may be formed of or include an organic light emitting material. The emission layer of the quantum dot light emitting display panel may include quantum dots and/or quantum rods. Hereinafter, the organic light emitting display panel will be described as an example of the display panel 210.

The input sensor 220 may sense an external input (e.g., a touch event) applied from the outside. In the present embodiment, the input sensor 220 may be a capacitive-type touch sensor, but the inventive concept is not limited to this example.

The driving circuit DIC may be disposed on the display panel 210. The driving circuit DIC may be electrically connected to the display panel 210 to provide electrical signals, which are used to drive the display panel 210, to the display panel 210.

The circuit module FTC may be electrically connected to the input sensor 220. In the present embodiment, the circuit module FTC may include a flexible circuit board CF and a sensor driving circuit TIC. The flexible circuit board CF may include lines. The lines may electrically connect the input sensor 220 to the sensor driving circuit TIC. The sensor driving circuit TIC may be mounted on the flexible circuit board CF (e.g., in the form of a chip-on film).

The circuit module FTC may connect the input sensor 220 to the display panel 210. The sensor driving circuit TIC may be omitted. The sensor driving circuit TIC and the driving circuit DIC may be provided as a single integrated circuit.

Referring to FIG. 1C, the display panel 210 may include a display substrate 210-B, an encapsulation substrate 210-U, and a sealing member SM attaching the display substrate 210-B to the encapsulation substrate 210-U. The display substrate 210-B may include pixels for producing an image. The encapsulation substrate 210-U may seal the pixels and may prevent the pixels from being damaged by external moisture or the like. A gap may be formed between the display substrate 210-B and the encapsulation substrate 210-U by the sealing member SM.

The driving circuit DIC may be coupled to the display substrate 210-B. The driving circuit DIC may be provided in the form of an integrated chip. However, the inventive concept is not limited to this example. For example, the driving circuit DIC may not be disposed on the display substrate 210-B.

Each of the display substrate 210-B and the encapsulation substrate 210-U may include a glass substrate serving as a base substrate thereof. The display substrate 210-B may have an area larger than that of the encapsulation substrate 210-U. The driving circuit DIC may be disposed on an exposed region of the display substrate 210-B, which is not veiled by the encapsulation substrate 210-U. For example, the driving circuit DIC may be disposed at an edge of the display substrate 210-B. However, the inventive concept is not limited to this example. For example, the display substrate 210-B and the encapsulation substrate 210-U may have substantially the same shape.

The sealing member SM may include, for example, frit. The frit is a ceramic adhesive material, which is melted and solidified through a laser exposure process. The frit may include 15-40 wt % $V_2O_5$, 10-30 wt % $TeO_2$, 1-15 wt % $P_2O_5$, 1-15 wt % BaO, 1-20 wt % ZnO, 5-30 wt % $ZrO_2$, 5-20 wt % $WO_3$, and 1-15 wt % BaO, which are used as a principal ingredient, and at least one of $Fe_2O_3$, CuO, MnO, $Al_2O_3$, $Na_2O$, or $Nb_2O_5$, which are used as an additive agent. If the frit is prepared to have the above composition, the frit may have a thermal expansion coefficient of $40$-$100 \times 10^{-7}$/° C. and a glass transition temperature of 250° C. to 400° C. The sealing member SM may be overlapped with the peripheral region NAA.

Figure 2A:
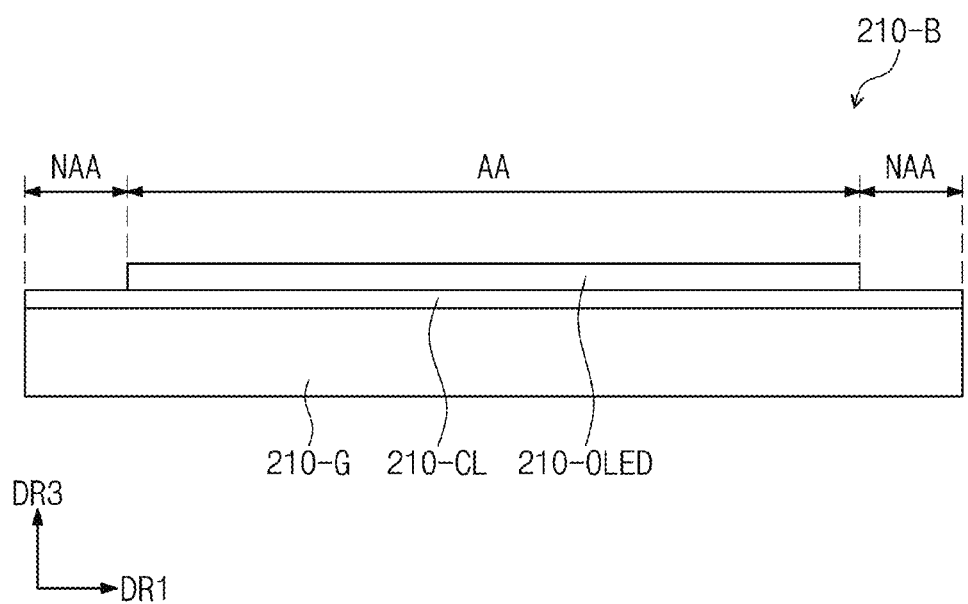
FIG. 2A is a sectional view of a display substrate shown in FIGS. 1B and 1C.
Figure 2B:
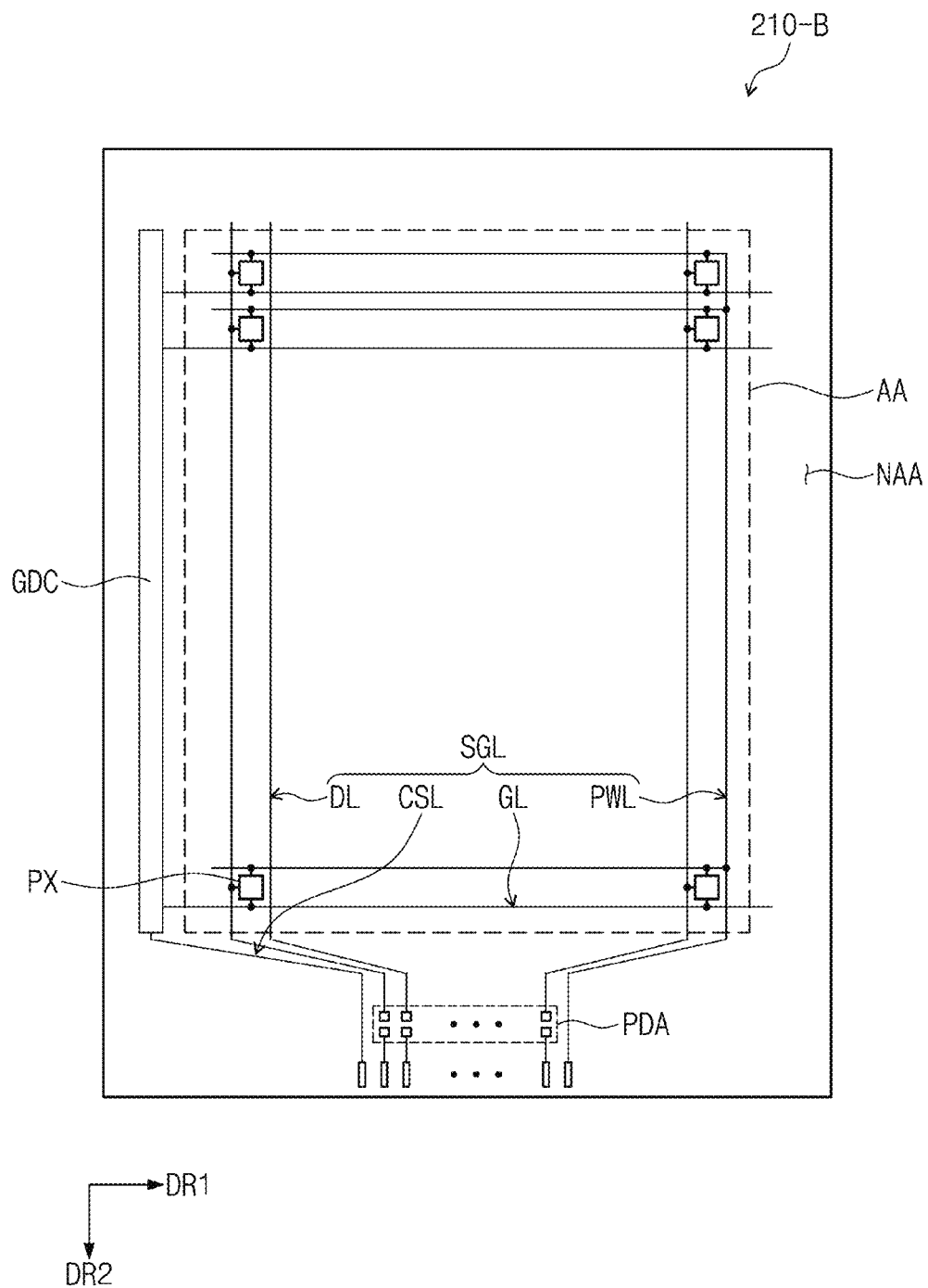
FIG. 2B is a plan view of the display substrate shown in FIGS. 1B and 1C.

FIG. 2A is a sectional view of the display substrate 210-B shown in FIGS. 1B and 1C. FIG. 2B is a plan view of the display substrate 210-B shown in FIGS. 1B and 1C. The display substrate 210-B according to an exemplary embodiment of the inventive concept will be described with reference to FIGS. 2A and 2B.

As shown in FIG. 2A, the display substrate 210-B may include a base substrate 210-G (hereinafter, a first base substrate), a circuit element layer 210-CL disposed on the first base substrate 210-G, and a display element layer 210-OLED. The display substrate 210-B may further include an insulating layer covering the display element layer 210-OLED.

The first base substrate 210-G may include a glass substrate, a metal substrate, or a substrate formed of an organic/inorganic composite material. The circuit element layer may include at least one insulating layer and at least one circuit device. The insulating layer may include at least one inorganic layer and at least one organic layer. The circuit device may include signal lines, a pixel driving circuit, and so forth. The display element layer 210-OLED may include at least organic light emitting diodes serving as an emission element. The display element layer 210-OLED may further include an organic layer, such as a pixel definition layer. The circuit element layer 210-CL may be provided in the active region AA and the peripheral region NAA, while the display element layer 210-OLED may be provided solely in the active region AA.

As shown in FIG. 2B, the display substrate 210-B may include a driving circuit GDC, a plurality of signal livres SGL, and a plurality of pixels PX.

The driving circuit GDC may include a scan driving circuit. The scan driving circuit may generate a plurality of scan signals and may sequentially output the scan signals to a plurality of scan lines GL to be described below. In addition, the scan driving circuit may output other control signals to a driving circuit of the pixel PX.

The scan driving circuit may include a plurality of transistors, which are formed by the same method as that for the driving circuit of the pixels PX or for example by a low-temperature polycrystalline silicon (LTPS) or low-temperature polycrystalline oxide (LTPO) process.

The signal lines SGL may include scan lines GL, data lines DL, a power line PWL, and a control signal line CSL. Each of the scan lines GL may be connected to corresponding ones of the pixels PX, and each of the data lines DL may be connected to corresponding ones of the pixels PX. The power line PWL may be connected to the pixels PX. The control signal line CSL may provide control signals to the scan driving circuit.

FIG. 2B illustrates a mounting region PDA, on which the driving circuit DIC (e.g., see FIG. 1C) is disposed. The driving circuit DIC may be connected to the data lines DL.

Figure 3:
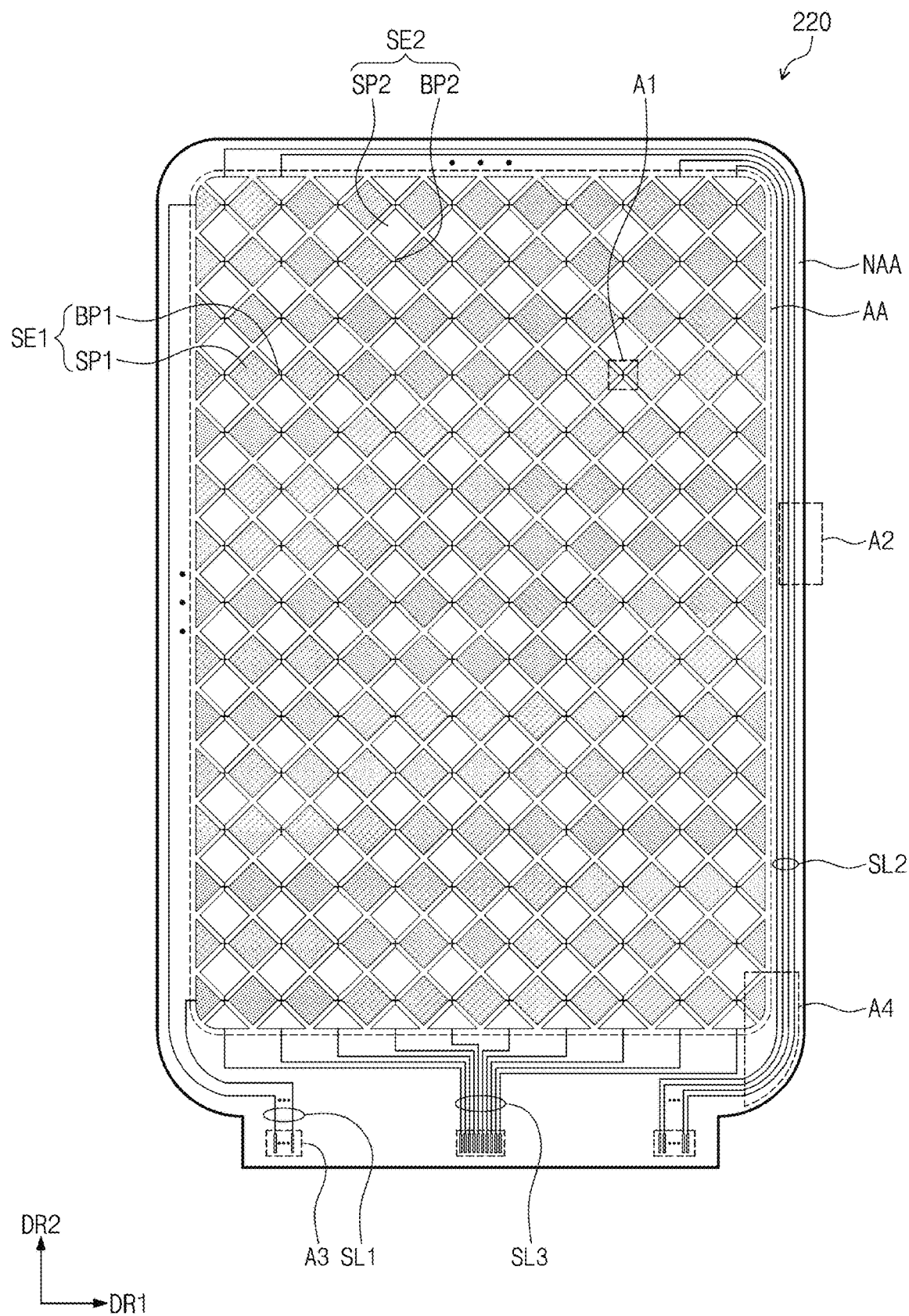
FIG. 3 is a plan view illustrating an input sensor according to an exemplary embodiment of the inventive concept.

FIG. 3 is a plan view illustrating the input sensor 220 according to an exemplary embodiment of the inventive concept. The input sensor 220 may be disposed on the display panel 210 (e.g., see FIG. 1B). The input sensor 220 may include a plurality of sensing electrodes SE1 and SE2, and a plurality of signal lines SL1, SL2, and SL3 connected to the sensing electrodes SE1 and SE2. The input sensor 220 may include a plurality of insulating layers and at least one test pattern. This will be described in more detail below.

The sensing electrodes SE1 and SE2 may be disposed in the active region AA. The sensing electrodes SE1 and SE2 may include a plurality of first sensing electrodes SE1 and a plurality of second sensing electrodes SE2 crossing each other. The first sensing electrodes SE1 may be extended in the first direction DR1 and may be arranged in the second direction DR2. Each of the first sensing electrodes SE1 may include a plurality of first sensing portions SP1 and a plurality of first intermediate portions BP1, which are arranged in the first direction DR1.

The second sensing electrodes SE2 may be extended in the second direction DR2 and may be arranged in the first direction DR1. Each of the second sensing electrodes SE2 may include a plurality of second sensing portions SP2 and a plurality of second intermediate portions BP2, which are arranged in the second direction DR2.

The signal lines SL1, SL2, and SL3 may be disposed in the peripheral region NAA. The signal lines SL1, SL2, and SL3 may include a plurality of first signal lines SL1, a plurality of second signal lines SL2, and a plurality of third signal lines SL3.

The first signal lines SL1 may be connected to ends of the first sensing electrodes SE1, respectively. For example, as shown in FIG. 3, the first signal lines SL1 may be connected to the first sensing electrodes SE1 at the left side of the input sensor 220. The second signal lines SL2 may be connected to ends of the second sensing electrodes SE2, respectively. For example, as shown in FIG. 3, the second signal lines SL2 may be connected to the second sensing electrodes SE2 at the top side of the input sensor 220. The third signal lines SL3 may be connected to opposite ends of the second sensing electrodes SE2, respectively. For example, as shown in FIG. 3, the third signal lines SL3 may be connected to the third sensing electrodes SE3 at the bottom side of the input sensor 220. However, the inventive concept is not limited to this connection structure of the sensing electrodes SE1 and SE2 and the signal lines SL1, SL2, and SL3.

Figure 4A:
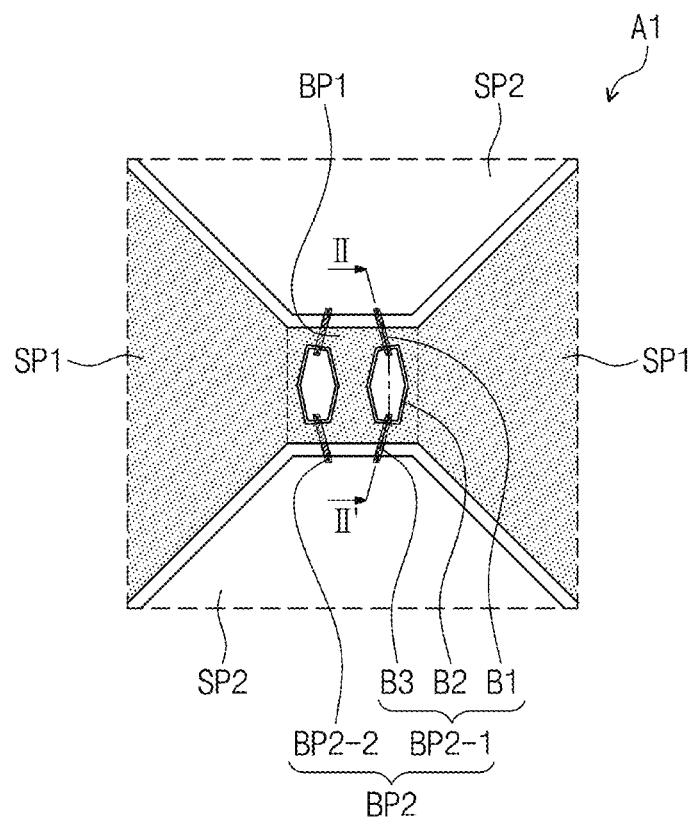
FIG. 4A is a plan view of a region 'A1' of FIG. 3.
Figure 4B:
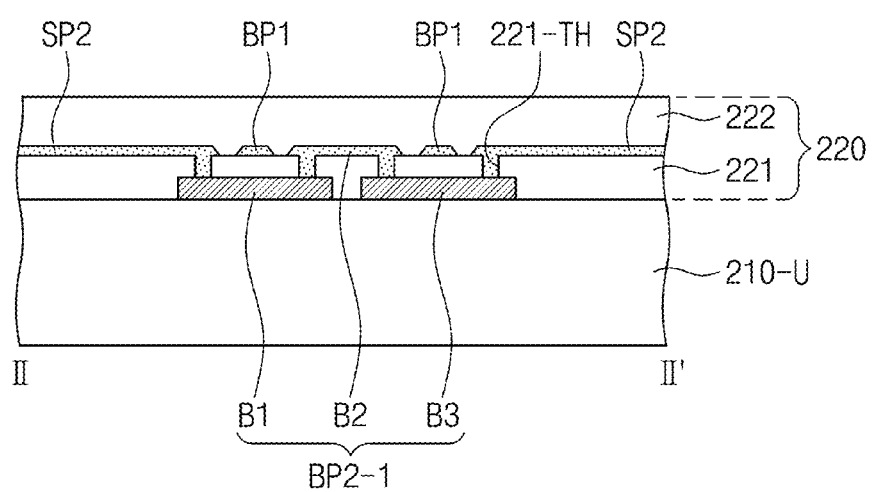
FIG. 4B is a sectional view taken along a line II-II' of FIG. 4A.

FIG. 4A is a plan view of a region 'A1' of FIG. 3. FIG. 4B is a sectional view taken along a line II-II' MP of FIG. 4A. Hereinafter, the input sensor 220 will be described in more detail with reference to FIGS. 4A and 4B, along with FIG. 3.

As shown in FIGS. 4A and 4B, the region 'A1' may correspond to an intersection region, at which the first sensing electrode SE1 and the second sensing electrode SE2 intersect with each other. The first intermediate portion BP1 and the second intermediate portion BP2 may be disposed in the intersection region. As shown in the present embodiment, the first sensing portion SP1 and the first intermediate portion BP1 may be provided as a single object, but the inventive concept is not limited to this example. For example, the second sensing portion SP2 and the second intermediate portion BP2 may be provided as a single object.

In the case where the sensing portion and the intermediate portion are not provided as a single object, they may be referred to as an electrode pattern and a bridge pattern. In other words, in the present embodiment, the second sensing electrode SE2 may include electrode patterns SP2 and bridge patterns BP2. Although two bridge patterns BP2-1 and BP2-2 are exemplarily illustrated to be disposed on one intersection region, the number of the bridge patterns is not limited to a specific value.

In the present embodiment, the bridge pattern BP2 may include a first portion B1, a second portion B2, and a third portion B3. The second portion B2 may be disposed on a layer different from that under the first portion B1 and the third portion B3. The second portion 132 may be disposed on the same layer as that under the electrode patterns SP2.

As shown in FIGS. 4A and 4B, the input sensor 220 may be directly disposed on the encapsulation substrate 210-U. In the present embodiment, the encapsulation substrate 210-U is exemplarily illustrated to include only a base substrate (hereinafter, a second base substrate), but the inventive concept is not limited to this example. In the present embodiment, a portion of the bridge pattern BP2 is exemplarily illustrated to be in contact with a top surface of the encapsulation substrate 210-U, but the inventive concept is not limited to this example. In an exemplary embodiment of the inventive concept, a buffer layer may be further disposed on the top surface of the encapsulation substrate 210-U, and a portion of the bridge pattern BP2 may be in contact with a top surface of the buffer layer. The buffer layer may include at least one of an inorganic layer or an organic layer.

In an exemplary embodiment of the inventive concept, the input sensor 220 may not be directly disposed on the encapsulation substrate 210-U, and in this case, an adhesive layer may be disposed between the input sensor 220 and the encapsulation substrate 210-U. A base layer of the input sensor 220 may be combined with the encapsulation substrate 210-U by the adhesive layer.

At least a portion of the bridge pattern BP2 may be disposed on the top surface of the encapsulation substrate 210-U. The first portion B1 and the third portion 133 may be disposed on the top surface of the encapsulation substrate 210-U. The first portion B1 and the third portion B3 may include at least one of metallic materials. For example, the first portion B1 and the third portion B3 may be formed of or include titanium (Ti), aluminum (Al), copper (Cu), gold (Au), or silver (Ag). The first portion B1 and the third portion B3 may be a multi-layered structure including a metal layer made of the metallic material.

In an exemplary embodiment of the inventive concept, the bridge pattern BP2 may include only a metal pattern disposed on the top surface of the encapsulation substrate 210-U. The bridge pattern BP2 may not cross the first intermediate portion BP1.

A first insulating layer 221 may be disposed on the top surface of the encapsulation substrate 210-U. The first sensing electrode SE1, the electrode patterns SP2, and the second portion B2 may be disposed on the first insulating layer 221. An opening, in which the second portion B2 is disposed, may be provided in the first intermediate portion BP1. The electrode patterns SP2 and the second portion B2 may be connected to the bridge pattern BP2 through penetration holes 221-TH, which are formed to penetrate the first insulating layer 221.

The first sensing electrode SE1, the electrode patterns SP2, and the second portion B2 may be formed of or include the same material. The first sensing electrode SE1, the electrode patterns SP2, and the second portion B2 may include a transparent conductive oxide (TCO) material. The first sensing electrode SE1, the electrode patterns SP2, and the second portion B2 may be formed of or include indium tin oxide (ITO), indium zinc oxide (IZO), zinc oxide (ZnO), indium tin zinc oxide (ITZO), PEDOT, a metal nano wire, or graphene.

A second insulating layer 222 may be disposed on the first insulating layer 221. The second insulating layer 222 may cover the first sensing electrode SE1, the electrode patterns SP2, and the second portion B2. The first insulating layer 221 and the second insulating layer 222 may be formed of or include an inorganic material or an organic material.

Figure 5A:
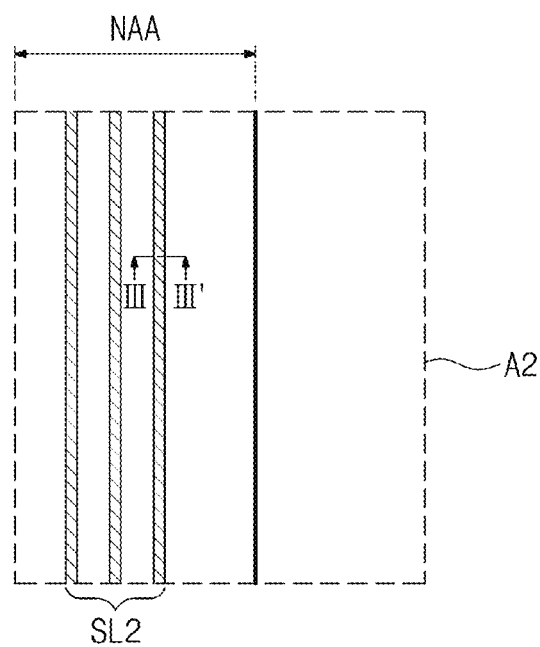
FIG. 5A is a plan view of a region 'A2' of FIG. 3.
Figure 5B:
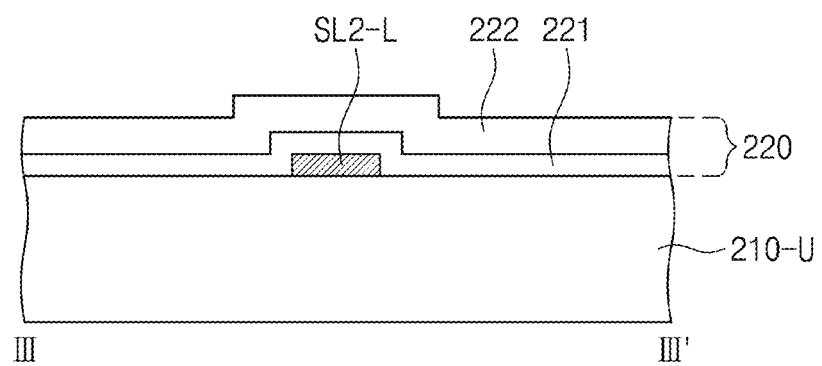
FIG. 5B is a sectional view taken along a line III-III' of FIG. 5A.

FIG. 5A is a plan view of a region 'A2' of FIG. 3. FIG. 5B is a sectional view taken along a line III-III' of FIG. 5A.

Figure 6A:
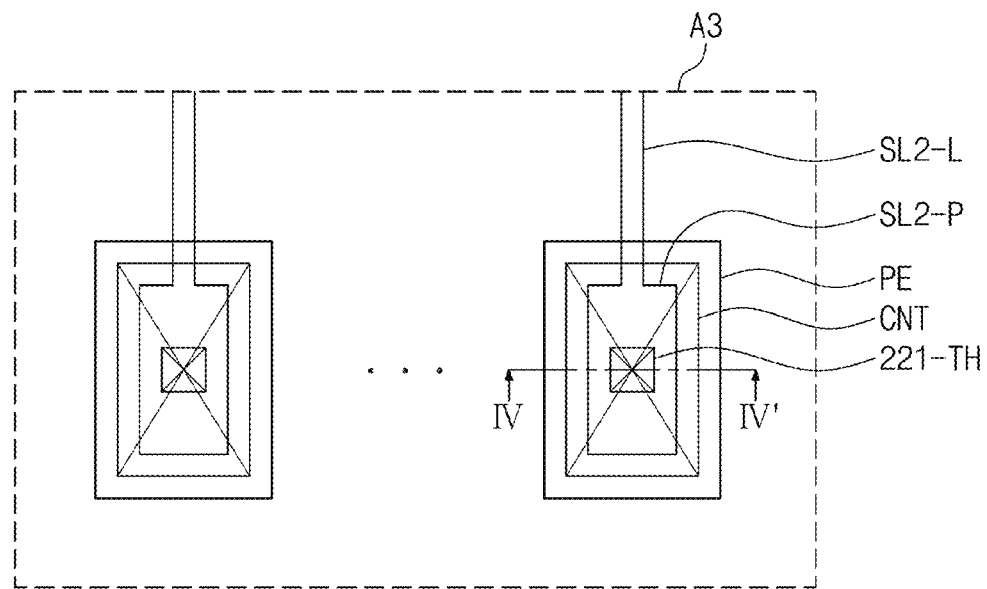
FIG. 6A is a plan view of a region 'A3' of FIG. 3.
Figure 6B:
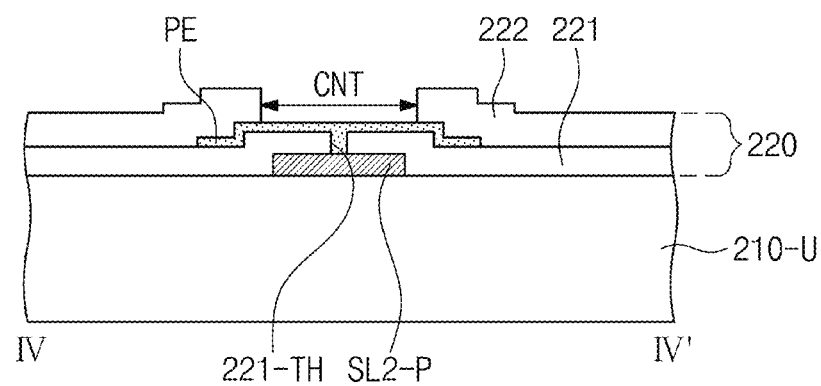
FIG. 6B is a sectional view taken along a line IV-IV' of FIG. 6A.

FIG. 6A is a plan view of a region 'A3' of FIG. 3. FIG. 6B is a sectional view taken along a line IV-IV' of FIG. 6A. Hereinafter, the input sensor 220 will be described in more detail with reference to FIGS. 3, 4A, 4B, 5A, 5B, 6A, and 6B.

As shown in FIGS. 5A to 6B, second the signal line SL2 may include a line portion SL2-L and a pad portion SL2-P. The line portion SL2-L, and the pad portion SL-2 may be classified, based on a position relative to the flexible circuit board CF (e.g., see FIG. 1B). A portion of the second signal line SL2 overlapped with the flexible circuit board CF may be referred to as the pad portion SL2-P.

As shown in FIGS. 5A and 5B, the line portion SL2-L may be disposed beneath the first insulating layer 221 and the second insulating layer 222. The line portion SL2-L may be formed by the same process as that for the first and third portions B1 and B3 of the bridge pattern BP2 and may be formed of or include the same material as the first and third portions B1 and B3 of the bridge pattern BP2.

As shown in FIGS. 6A and 6B, the pad portion SL2-P and the line portion SL2-L may be provided as a single object. In an exemplary embodiment of the inventive concept, the pad portion SL2-P and the line portion SL2-L may have the same width, unlike the structure shown in FIG. 6A.

The input sensor 220 may further include a pad electrode PE. The pad electrode PE may be disposed on the first insulating layer 221 and may be connected to the pad portion SL2-P through the penetration hole 221-TH penetrating the first insulating layer 221. The second insulating layer 222 may have a contact hole CNT exposing at least the pad electrode PE. The pad electrode PE may be electrically coupled to a pad of the flexible circuit board CF through an anisotropic conductive film, a solder ball, or the like. The pad electrode PE may be formed of or include the same material as the first sensing electrode SE1. In other words, the pad electrode PE may be formed of or include the same transparent conductive oxide as the first sensing portions SP1 (e.g., see FIG. 4B).

Figure 7A:
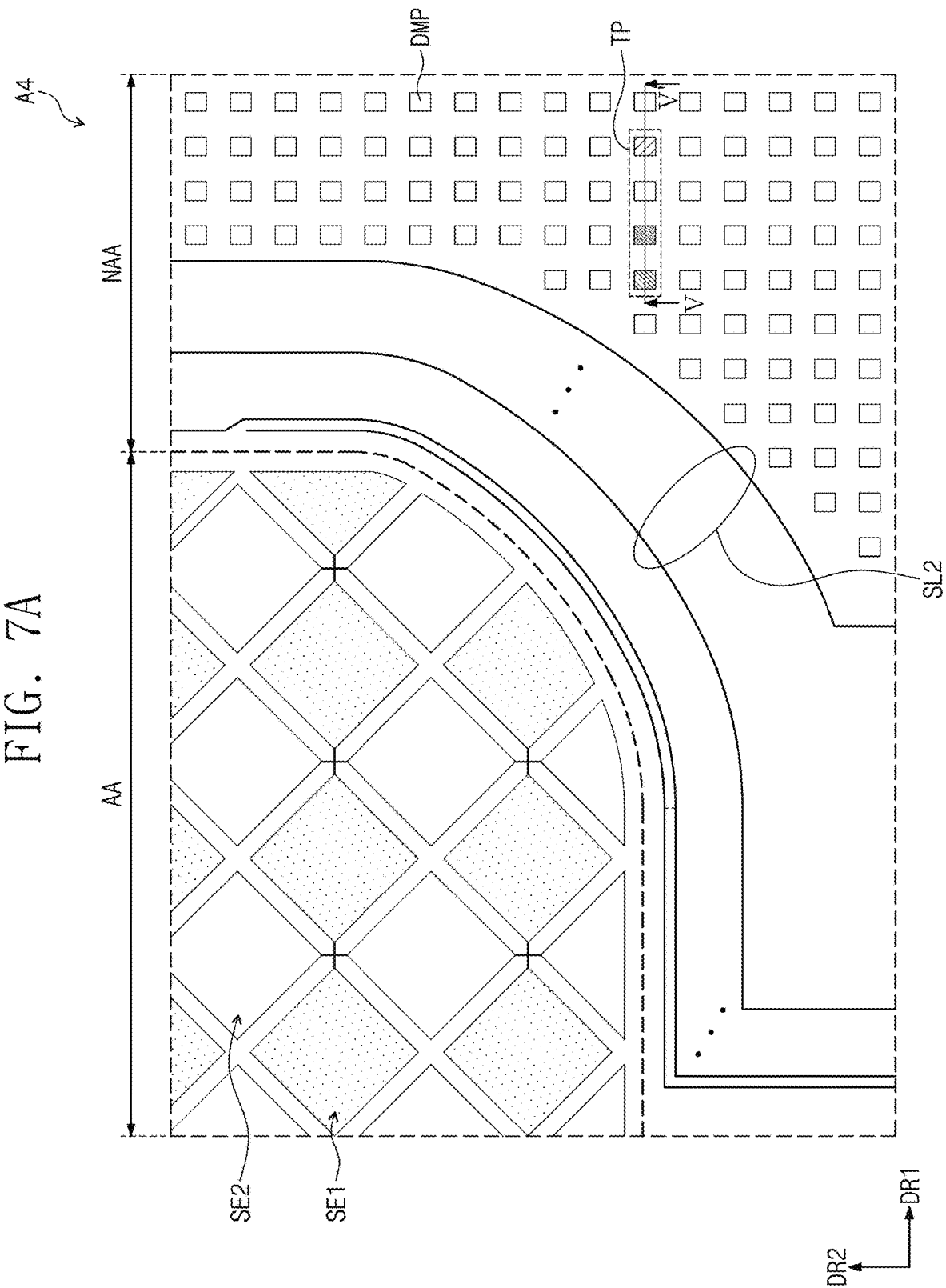
FIG. 7A is a plan view of a region 'A4' of FIG. 3.
Figure 7B:
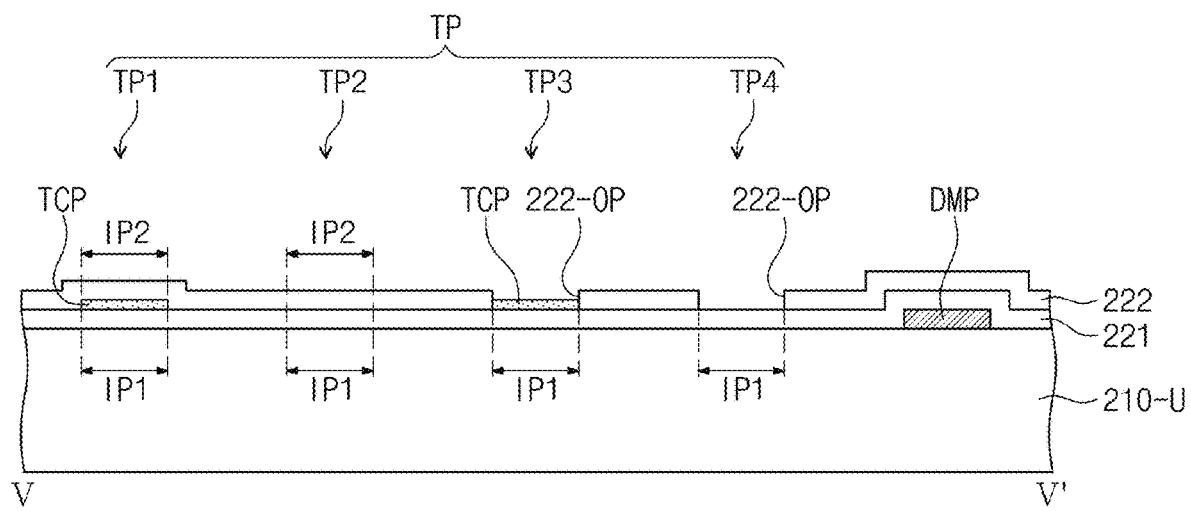
FIG. 7B is a sectional view taken along a line V-V' of FIG. 7A.
Figure 7C:
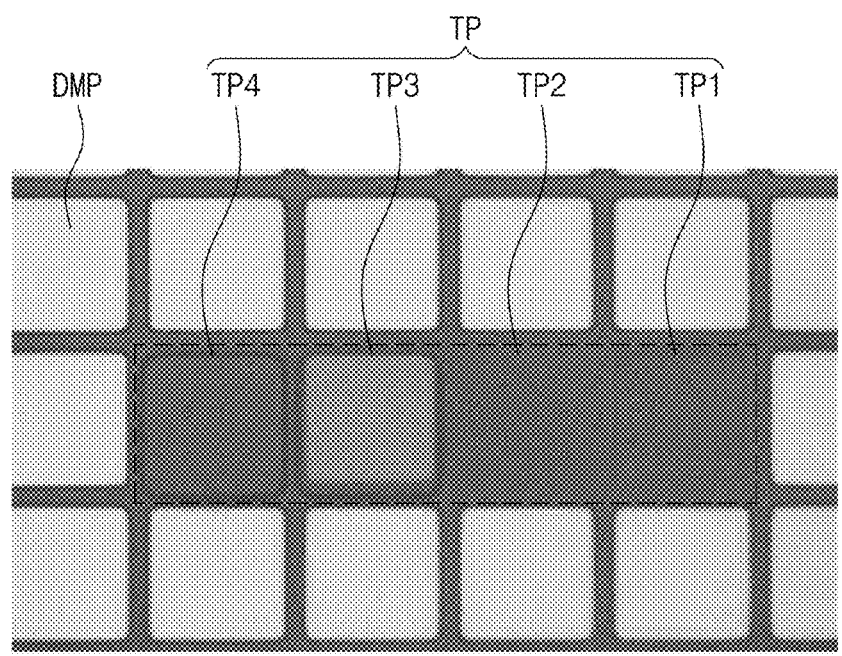
FIG. 7C is a microscope image of a test pattern of FIG. 7A.
Figure 7D:
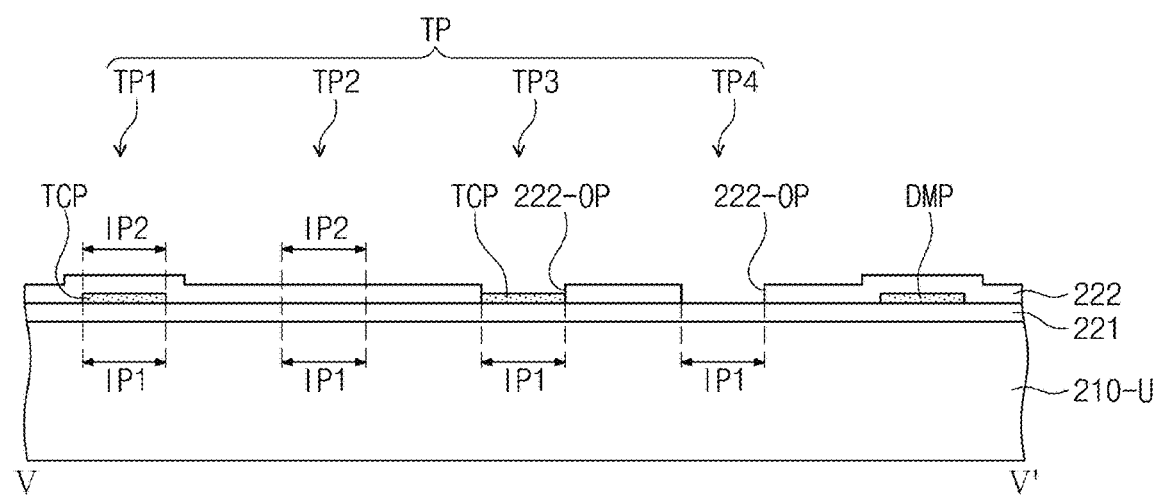
FIGS. 7D and 7E are sectional views taken along the line V-V' of FIG. 7A.
Figure 7E:
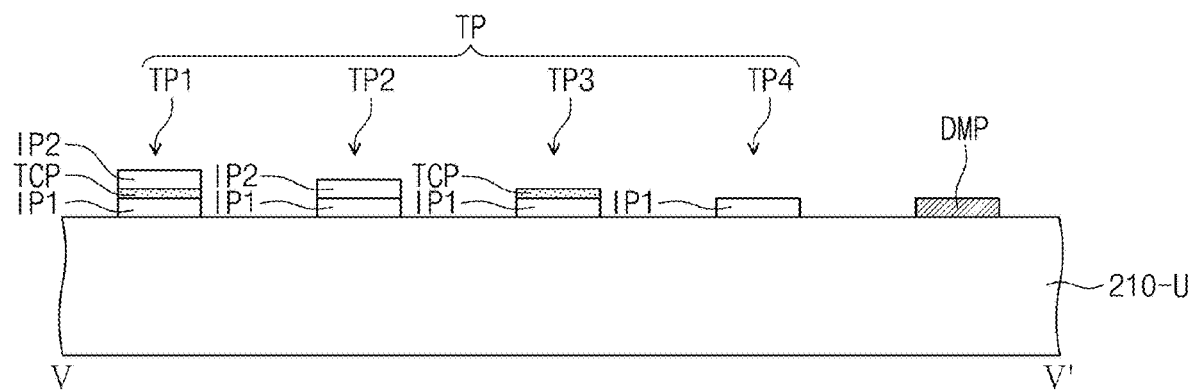

FIG. 7A is a plan view of a region 'A4' of FIG. 3. FIG. 7B is a sectional view taken along a line V-V' of FIG. 7A. FIG. 7C is a microscope image of a test pattern TP of FIG. 7A. FIGS. 7D and 7E are sectional views taken along the line V-V' of FIG. 7A. Hereinafter, the input sensor 220 will be described in more detail with reference to FIGS. 3, 4A to 7A, 4B to 7B, 7C, 7D, and 7E.

As shown in FIGS. 7A and 7B, the input sensor 220 may include a test pattern TP. The test pattern TP may be disposed at the outside of the second signal line SL2. The test pattern TP may be a test region.

In an exemplary embodiment of the inventive concept, the test pattern TP may include at least first, second, third and fourth test patterns TP1, TP2, TP3, and TP4. The first to fourth test patterns TP1, TP2, TP3, and TP4 may have different stacking structures from each other. At least one of the first to fourth test patterns TP1, TP2, TP3, and TP4 may include a conductive pattern. At least one or all of the first to fourth test patterns TP1, TP2, TP3, and TP4 may include an insulating pattern.

Here, the insulating pattern may be a region of an insulating layer. For example, the insulating pattern of the first test pattern TP1 and the insulating pattern of the third test pattern TP3 may be different regions of a single insulating layer. This will be described in more detail below.

The first test pattern TP1 may include a conductive pattern TCP, a first insulating pattern IP1 overlapped with the conductive pattern TCP, and a second insulating pattern IP2 disposed on the first insulating pattern IP1. In other words, the first test pattern TP1 may be disposed between the first and second insulating patterns IP1 and IP2. The second test pattern TP2 may include the first insulating pattern IP1 and the second insulating pattern IP2 disposed on the first insulating pattern IP1. The third test pattern TP3 may include the conductive pattern TCP and the first insulating pattern IP1. The fourth test pattern TP4 may include the first insulating pattern IP1. The stacking structure of the first to fourth test patterns TP1, TP2, TP3, and TP4 will be described with reference to FIG. 7B.

Referring to FIG. 7B, in the present embodiment, the first test pattern TP1 may include the first insulating pattern IP1, the conductive pattern TCP, and the second insulating pattern IP2, which are sequentially stacked on the top surface of the encapsulation substrate 210-U. The second test pattern TP2 may include the first insulating pattern IP1 and the second insulating pattern IP2, which are sequentially stacked on the top surface of the encapsulation substrate 210-U. The third test pattern TP3 may include the insulating pattern IP1 and the conductive pattern TCP, which are sequentially stacked on the top surface of the encapsulation substrate 210-U. The fourth test pattern TP4 may include the insulating pattern IP1 on the top surface of the encapsulation substrate 210-U. The conductive patterns TCP of the first and third test patterns TP1 and TP3 may be formed of or include the same material as the first sensing portion SP1 of FIG. 4B.

In an exemplary embodiment of the inventive concept, the conductive patterns TCP of the first and third test patterns TP1 and TP3 may be formed of or include the same material as the first portion B1 of FIG. 4B. Here, the stacking order of the first and third test patterns TP1 and TP3 may be changed. For example, the first test pattern TP1 may include the conductive pattern TCP, the first insulating pattern IP1, and the second insulating pattern IP2, which are sequentially disposed on the top surface of the encapsulation substrate 210-U.

In an exemplary embodiment of the inventive concept, the conductive pattern TCP of the first test pattern TP1 may be formed of or include the same material as one of the first sensing portion SP1 and the first portion B1 shown in FIG. 4B. Here, the conductive pattern TCP of the third test pattern TP3 may be formed of or include the same material as the other of the first sensing portion SP1 and the first portion B1 shown in FIG. 4B.

The first insulating layer 221 may include a first region, a second region, a third region and a fourth region, which are different from each other and correspond to the first insulating pattern IP1 of the first test pattern TP1, the first insulating pattern IP1 of the second test pattern TP2, the first insulating pattern IP1 of the third test pattern TP3, and the first insulating pattern IP1 of the fourth test pattern TP4. The second insulating layer 222 may include a first region and a second region, which are different from each other and correspond to the second insulating pattern IP2 of the first test pattern TP1 and the second insulating pattern IP2 of the second test pattern TP2. An opening 222-OP corresponding to the conductive pattern TCP of the third test pattern TP3 may be formed in the second insulating layer 222. Another opening 222-OP corresponding to the first insulating pattern IP1 of the fourth test pattern TP4 may be thrilled in the second insulating layer 222.

FIG. 7B illustrates an example, in which four test patterns TP1, TP2, TP3, and TP4 are provided, but in another exemplary embodiment of the inventive concept, the fourth test pattern TP4 may be omitted.

Exemplary embodiments of the inventive concept are not limited to a specific arrangement and planar shapes of the first to fourth test patterns TP1 to TP4. In other words, the inventive concept is not limited to a specific planar shape of the conductive pattern TCP. For example, the shape of the test pattern, which does not include the conductive pattern TCP, is sufficient if it can correspond to the shape of the conductive pattern TCP. The first to fourth test patterns TP1 to TP4 may have the same shape, when viewed in a plan view.

As shown in FIGS. 7A and 7B, a dummy pattern DMP may be disposed near the test pattern TP. In an exemplary embodiment of the inventive concept, a plurality of dummy patterns DMP may be provided. As shown in FIG. 7B, the dummy pattern DMP may be disposed beneath the first and second insulating layers 221 and 221. The dummy pattern DMP may adjust the reflectance of the peripheral region NAA to a value close to the reflectance of the active region AA. The dummy pattern DMP may be formed of or include a conductive material. The dummy pattern DMP may be formed of or include the same material as the second sensing electrodes SE2. In other words, the dummy pattern DMP may be formed of or include the same material as the third portion B3 shown in FIG. 4B.

The dummy pattern DMP may have the same shape as the first to third test patterns TP1 to TP3, when viewed in a plan view. In other words, the dummy pattern DMP may have the same shape as the conductive pattern TCP.

FIG. 7C shows an image of the first to fourth test patterns TP1 to TP4 taken by a microscope. Since the first to fourth test patterns TP1 to TP4 have different stacking structures from each other, there is a difference in reflectance of light irradiated onto the test patterns. Accordingly, four different kinds of images were obtained as shown in FIG. 7C. An image of the dummy pattern DMP is also illustrated in FIG. 7C. Since the dummy pattern DMP has a different stacking structure from those of the first to fourth test patterns TP1 to TP4, the image of the dummy pattern. DMP was different from the four different kinds of images of the first to fourth test patterns TP1 to TP4.

The fact that the four different kinds of images were obtained means that the first to fourth test patterns TP1 to TP4 were normally formed. If the conductive pattern TCP of the first test pattern TP1 was not formed, just three kinds of images would be obtained, because the first test pattern TP1 has the same stacking structure as that of the second test pattern TP2.

The obtained image may be used to examine whether there is a failure in the input sensor 220 and at which step of a process such a failure occurred. This will be described in more detail with reference to FIGS. 8A to 8E.

The test pattern TP according to another exemplary embodiment of the inventive concept will be described with reference to FIGS. 7D and 7E. The description that follows will mainly refer to features different from those of the test pattern TP described with reference to FIGS. 7A to 7B.

As shown in FIG. 7D, the dummy pattern DMP and the conductive pattern TCP may be disposed on the same layer. For example, in FIG. 7D, the dummy pattern DMP may be disposed on the first insulating layer 221. The dummy pattern DMP may be formed of or include the same material as the conductive pattern TCP.

As shown in FIG. 7E, the first test pattern TP1 may include the first insulating pattern IP1, the conductive pattern TCP, and the second insulating pattern IP2, which are sequentially disposed on the top surface of the encapsulation substrate 210-U. The second test pattern TP2 may include the first insulating pattern IP1 and the second insulating pattern IP2, which are sequentially disposed on the top surface of the encapsulation substrate 210-U. The third test pattern TP3 may include the insulating pattern IP1 and the conductive pattern TCP, which are sequentially disposed on the top surface of the encapsulation substrate 210-U. The fourth test pattern TP4 may include the insulating pattern IP1 disposed on the top surface of the encapsulation substrate 210-U.

In the present embodiment, the conductive patterns TCP of the first and third test patterns TP1 and TP3 may be formed of or include the same material as the first sensing portions SP1 of FIG. 4B. In the present embodiment, the conductive pattern TCP is described to include a material different from the dummy pattern DMP, but the inventive concept is not limited to this example. For example, the conductive pattern TCP may be formed of or include the same material as the dummy pattern DMP.

In an exemplary embodiment of the inventive concept, the conductive patterns TCP of the first and third test patterns TP1 and TP3 may be formed of or include the same material as the first portion B1 of FIG. 4B.

The first insulating patterns IP1 of the first to fourth test patterns TP1, TP2, TP3, and TP4 may be spaced apart from each other. The first insulating patterns IP1 of the first to fourth test patterns TP1, TP2, TP3, and TP4 may be formed of or include the same material as the first insulating layer 221 of FIG. 4B.

The second insulating patterns IP2 of the first and second test patterns TP1 and TP2 may be spaced apart from each other. The second insulating patterns IP2 of the first and second test patterns TP1 and TP2 may be formed of or include the same material as the second insulating layer 222 of FIG. 4B.

FIGS. 8A to 8E are side views illustrating a method of fabricating the display device EA, according to an exemplary embodiment of the inventive concept. For concise description, an element previously described with reference to FIGS. 1 to 7C may be identified by the same reference number without repeating an overlapping description thereof.

Figure 8A:
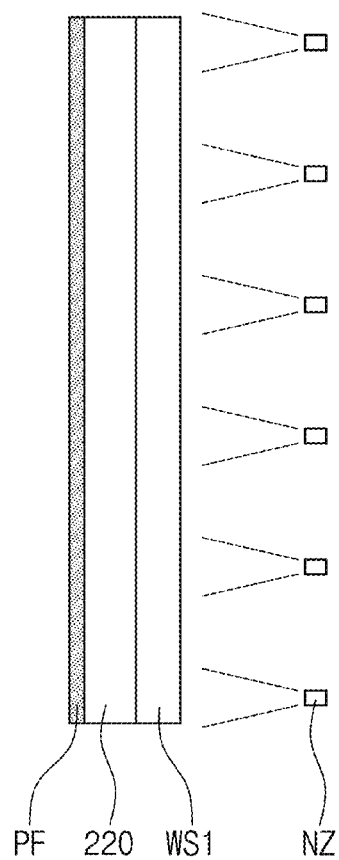
FIGS. 8A, 8B, 8C, 8D and 8E are side views illustrating a method of fabricating a display device, according to an exemplary embodiment of the inventive concept.

As shown in FIG. 8A, a first working substrate WS1, on which the input sensor 220 is disposed, may be etched. The first working substrate WS1 may include a plurality of cell regions. One input sensor 220 may be disposed on one cell region. Since the input sensor 220 was described with reference to FIGS. 3 to 7C, a detailed description thereof will be omitted.

A protection layer PF may be disposed on the input sensor 220. The protection layer PF may be attached to the input sensor 220 by an adhesive layer. The protection layer PF may protect the pad electrode PE. For example, the protection layer PF may prevent the pad electrode PE, which is exposed to the outside, from being damaged by an etching solution sprayed from a nozzle NZ.

The first working substrate WS1 may include a glass substrate, and a thickness of the first working substrate WS1 may be reduced by an etching process. In the case where the input sensor 220 is formed on a working substrate thinner than a reference thickness, the working substrate may be damaged, and thus, a failure may occur in the input sensor 220. In the case where the input sensor 220 is formed on a working substrate thicker than a reference thickness and then the working substrate is thinned, it is possible to prevent such a failure and to fabricate a slim display device.

Figure 8B:
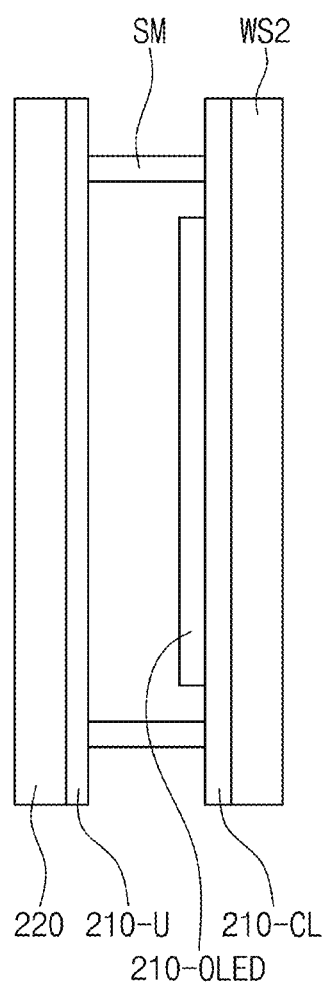

As shown in FIG. 8B, the etched first working substrate 210-U may be combined with a second working substrate WS2, on which pixels are disposed. The etched first working substrate 210-U may correspond to the encapsulation substrate 210-U described with reference to FIGS. 4A and 4B. The pixel may be formed by the circuit element layer 210-CL and the display element layer 210-OLED, as described with reference to FIGS. 2A and 2B. The pixel may include at least an emission element. The second working substrate WS2 may include a plurality of cell regions. One display substrate 210-B (e.g., see FIG. 1C) may be disposed on one cell region.

The input sensor 220 may be disposed on an outer surface of the etched first working substrate 210-U, and the circuit element layer 210-CL and the display element layer 210-OLED may be disposed between the etched first working substrate 210-U and the second working substrate WS2. The etched first working substrate 210-U and the second working substrate WS2 may be combined with each other using the sealing member SM. The first and second working substrates 210-U and WS2, which are combined with each other, may be referred to as a working panel.

Figure 8C:
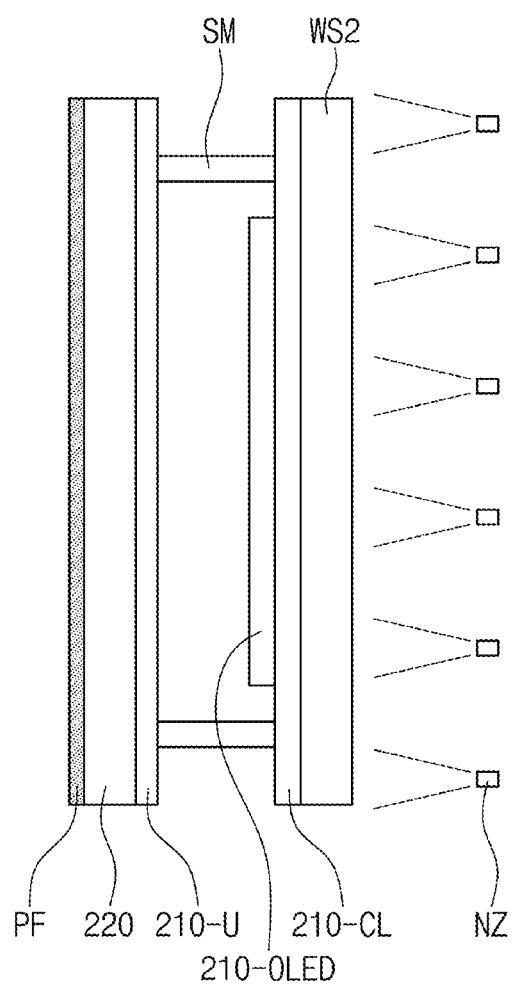

As shown in FIG. 8C, the second working substrate WS2 may be etched. The protection layer PF may be disposed on the input sensor 220. The protection layer PF may protect the input sensor 220 from an etching solution.

The second working substrate WS2 may be an organic substrate, and a thickness of the second working substrate WS2 may be reduced by an etching process. In the case where the display substrate 210-B is formed on a working substrate thinner than a reference thickness, the working substrate may be damaged, and in this case, a failure may occur in the display substrate 210-B. In the case where the circuit element layer 210-CL and the display element layer 210-OLED are formed on a working substrate thicker than a reference thickness and then the working substrate is thinned, it is possible to prevent such a failure and to fabricate a slim display device.

Figure 8D:
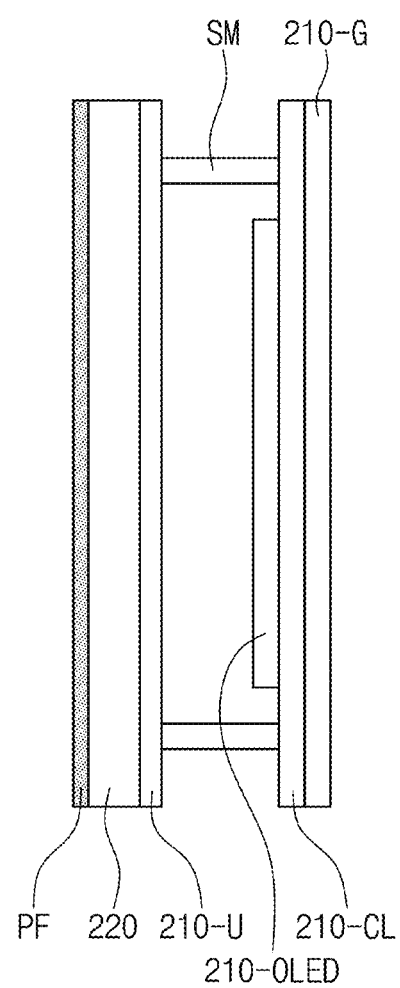

As shown in FIG. 8D, the thinned second working substrate WS2 may correspond to the base substrate 210-G shown in FIG. 2A. One sealing element SM is illustrated in FIGS. 8B to 8D, but the sealing element SM may be disposed in every cell region US (see FIG. 8E), as will be described below.

Figure 8E:
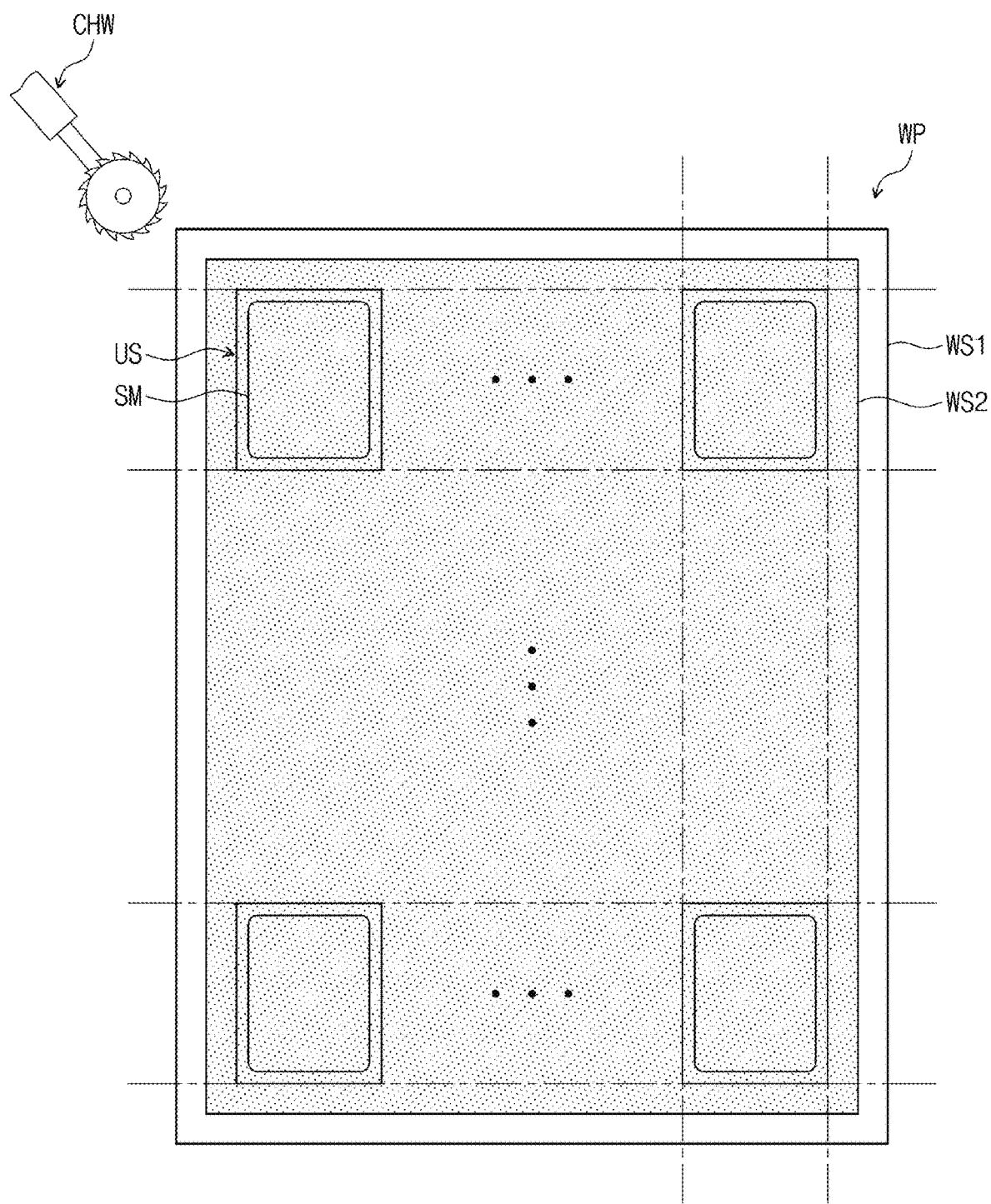

Thereafter, as shown in FIG. 8E, a working panel WP may be cut in units of cell region. US. A display device may be formed for each cell region US. In an exemplary embodiment of the inventive concept, a cutting wheel CHW may be used to cut the working panel WP.

The test step described with reference to FIG. 7C may be performed after the etching process of FIG. 8A. In addition, the test step described with reference to FIG. 7C may be performed after the etching process of FIG. 8C. It is possible to determine whether the pad electrode PE is damaged by the etching process, from the third test pattern TP3 shown in FIGS. 7B and 7C. Since the conductive pattern TCP of the third test pattern TP3 and the pad electrode PE are disposed on the same layer and are exposed to the outside, they may be placed under the same environment. In the case where the input sensor 220 is properly protected by the protection layer PF during the process of FIGS. 8A and 8C, it is possible to detect the third test pattern TP3 that is distinct from the fourth test pattern TP4.

In the case where the pad electrode PE is damaged, it is possible to determine at which step in a fabrication process the damage occurred, from the test pattern TP of FIGS. 7B and 7C. In the case where, as described above, the pad electrode PE is damaged during the etching process, the third test pattern TP3 may not be detected.

In the case where a failure of the pad electrode PE is caused by a step in a fabrication process of the input sensor 220 performed before the etching process, the first test pattern TP1 may not be detected. In other words, the first test pattern TP1, in which a failure occurs, may not be differentiated from the second test pattern TP2. In the case where the conductive pattern TCP of the first test pattern TP1 is not provided, the first test pattern TP1, in which the failure occurs, may have the double-layered structure including the insulating patterns IP1 and IP2, like the second test pattern TP2.

Figure 9A:
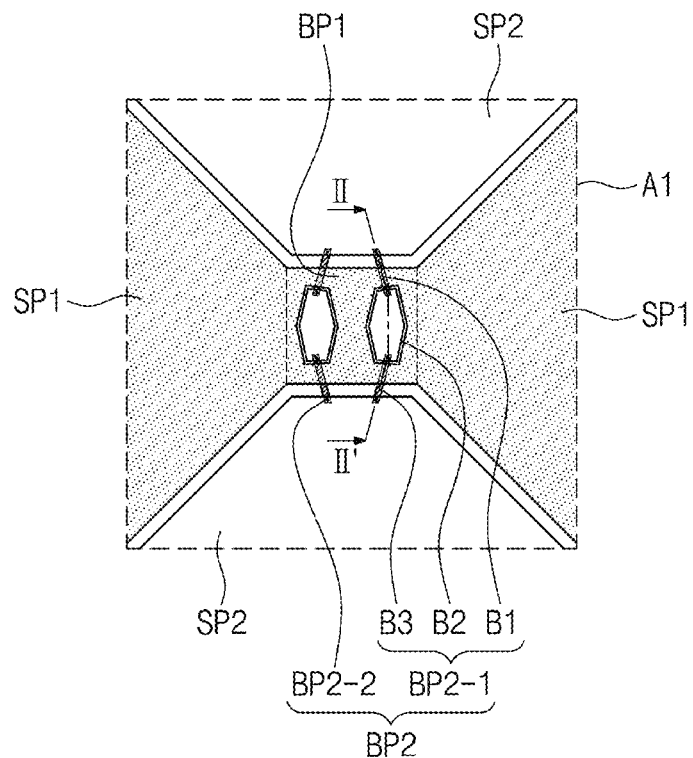
FIG. 9A is a plan view illustrating an input sensor according to an exemplary embodiment of the inventive concept.
Figure 9B:
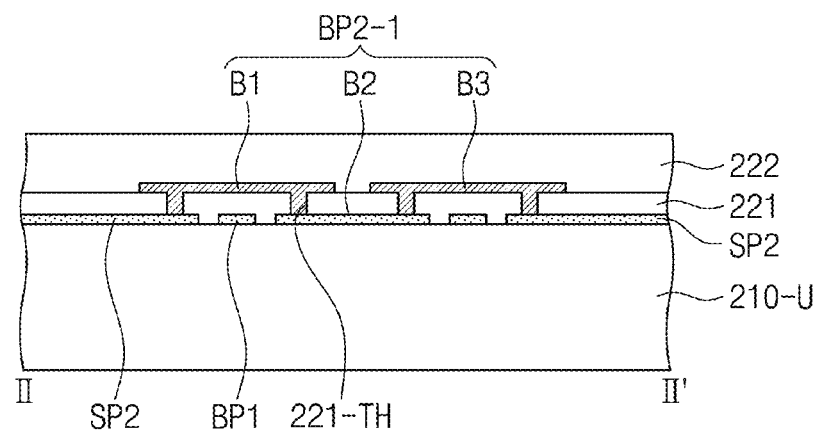
FIG. 9B is a sectional view taken along a line II-II' of FIG. 9A.

FIG. 9A is a plan view illustrating the input sensor 220 according to an exemplary embodiment of the inventive concept. FIG. 9B is a sectional view taken along a line II-II' of FIG. 9A. FIG. 9A illustrates a planar structure corresponding to FIG. 4A.

In the present embodiment, the second sensing electrode SE2 may include the electrode patterns SP2 and the bridge patterns BP2. A structure, in which two bridge patterns BP2-1 and BP2-2 are disposed in one intersection region, is illustrated as an example.

The second portion B2 may be disposed on a layer different from the first portion B1 and the third portion B3. For example, the second portion B2 may be disposed under the first portion B1 and the third portion B3. The second portion B2 may be disposed on the top surface of the encapsulation substrate 210-U, like the electrode patterns SP2. The second portion B2 may include the same material as the electrode patterns SP2. In other words, the second portion B2 and the second electrode patterns SP2 may be disposed in the same layer. The second portion B2 may include a transparent conductive oxide (TCO) material. The first portion B1 and the third portion B3 may include at least one of metallic materials.

Figure 10:
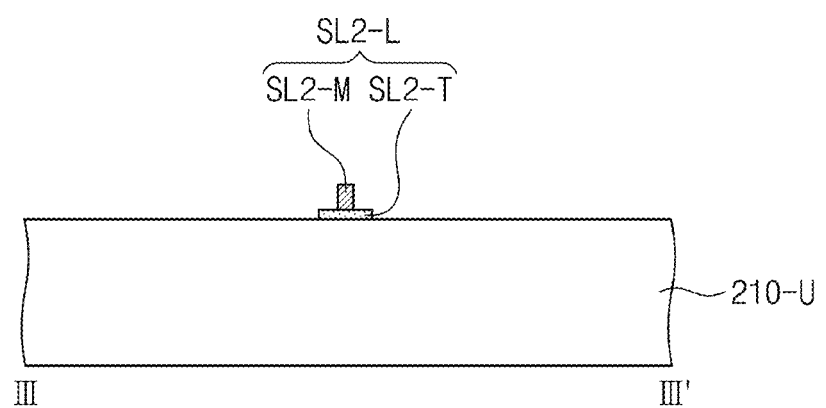
FIG. 10 is a sectional view illustrating an input sensor according to an exemplary embodiment of the inventive concept.
Figure 11A:
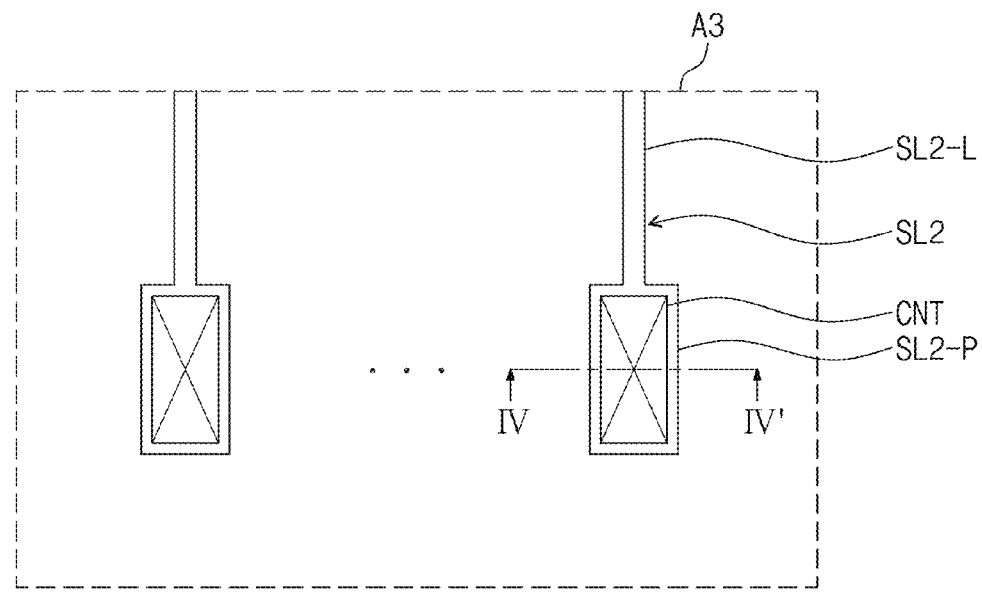
FIG. 11A is a plan view illustrating an input sensor according to an exemplary embodiment of the inventive concept.
Figure 11B:
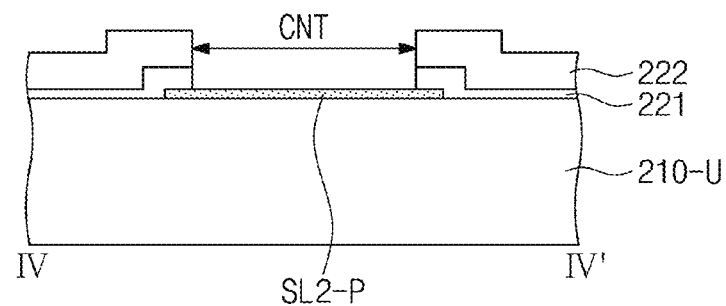
FIG. 11B is a sectional view taken along a line IV-IV' of FIG. 11A.

HG. 10 is a sectional view illustrating the input sensor 220 according to an exemplary embodiment of the inventive concept. FIG. 11A is a plan view illustrating the input sensor 220 according to an exemplary embodiment of the inventive concept. FIG. 11B is a sectional view taken along a line IV-IV' of FIG. 11A. FIG. 10 illustrates a sectional structure corresponding to FIG. 5B.

In the present embodiment, the first insulating layer 221 and the second insulating layer 222 may not be disposed on the peripheral region NAA. The second signal line SL2 may include the line portion SL2-L and the pad portion SL2-P, which is extended from an end of the line portion SL2-L.

The line portion SL2-L according to the present embodiment may include a lower layer SL2-T and an upper layer SL2-M disposed on the lower layer SL2-T. The upper layer SL2-M may be formed of or include the same material as the first portion B1 of the bridge pattern BP2-1 (e.g., see FIG. 9B), which is disposed on the first insulating layer 221. The lower layer SL2-T may be formed of or include the same material as the electrode pattern SP2 (e.g., see FIG. 9B).

Referring to FIGS. 11A and 11B, the pad portion SL2-P may be extended from the lower layer SL2-T (e.g., see FIG. 10). The pad portion SL2-P may be formed of or include the same material as the electrode pattern SP2. The pad portion SL2-P may be exposed from the first insulating layer 221 and the second insulating layer 222. The contact hole CNT may be provided in the first insulating layer 221 and the second insulating layer 222 to expose at least the pad portion SL2-P.

Figure 12A:
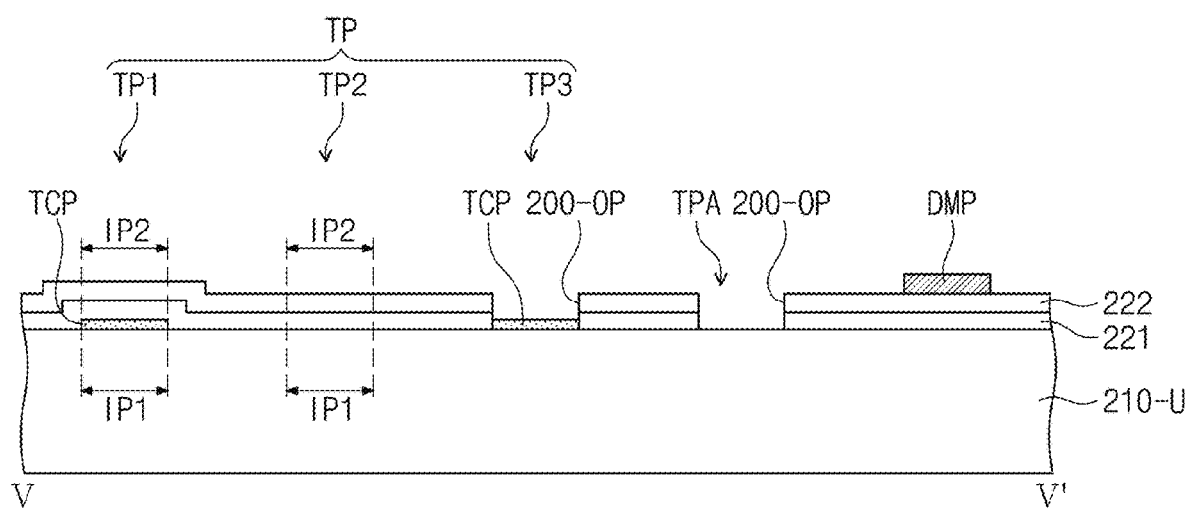
FIG. 12A is a sectional view illustrating an input sensor according to an exemplary embodiment of the inventive concept.
Figure 12B:
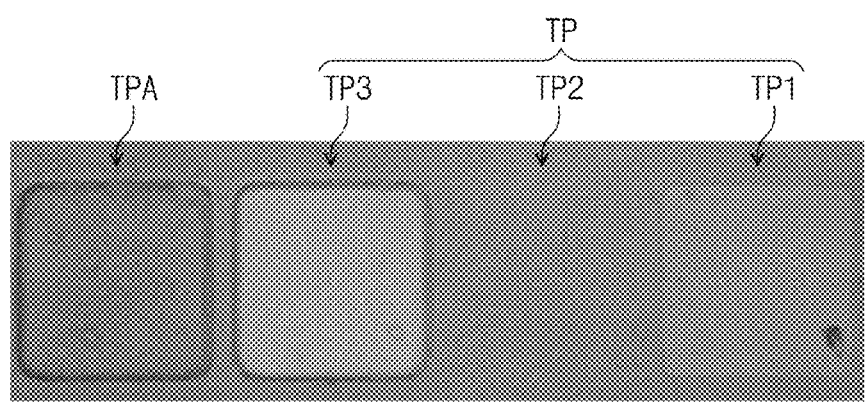
FIG. 12B is a microscope image of a test pattern of an input sensor according to an exemplary embodiment of the inventive concept.
Figure 12C:
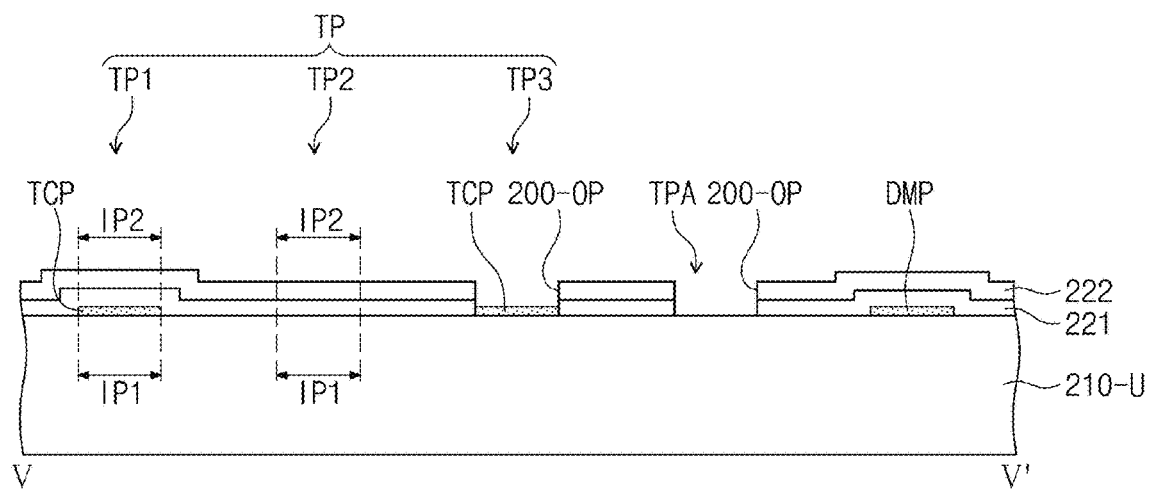
FIGS. 12C and 12D are sectional views illustrating an input sensor according to an exemplary embodiment of the inventive concept.
Figure 12D:
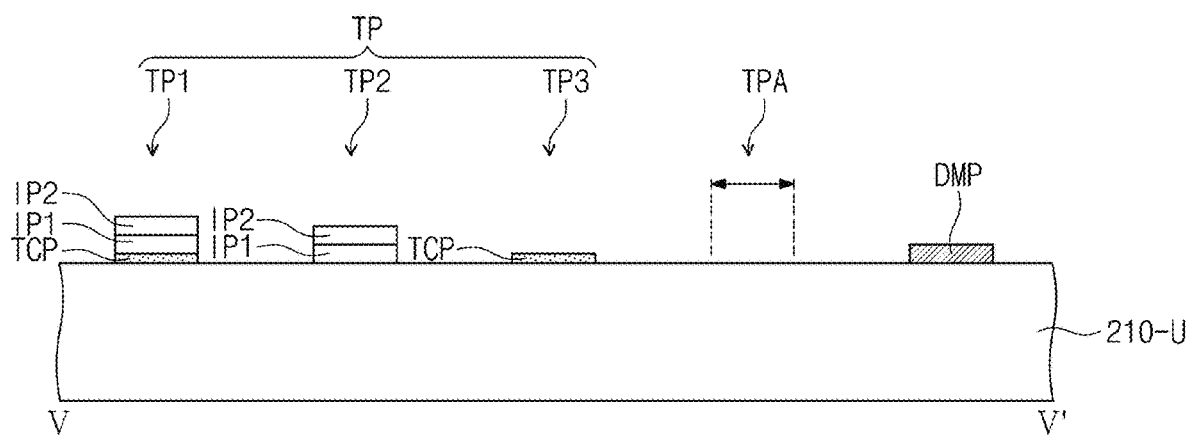

FIG. 12A is a sectional view illustrating the input sensor 220 according to an exemplary embodiment of the inventive concept. FIG. 12B is a microscope image of the test pattern TP of the input sensor 220 according to an exemplary embodiment of the inventive concept. FIGS. 12C and 12D are sectional views illustrating the input sensor 220 according to an exemplary embodiment of the inventive concept. FIGS. 12A, 12C, and 12D illustrate sections, each of which corresponds to FIG. 7B. For concise description, an element previously described with reference to FIGS. 1 to 11B may be identified by the same reference number without repeating an overlapping description thereof.

In the present embodiment, the test pattern TP may include at least the first to third test patterns TP1, TP2, and TP3. In the present embodiment, the first test pattern TP1 may include the conductive pattern TCP, the first insulating pattern IP1, and the second insulating pattern IP2, which are sequentially stacked on the top surface of the encapsulation substrate 210-U. The second test pattern TP2 may include the first insulating pattern IP1 and the second insulating pattern IP2, which are sequentially stacked on the top surface of the encapsulation substrate 210-U. The third test pattern TP3 may include the conductive pattern TCP, which is disposed on the top surface of the encapsulation substrate 210-U.

The conductive pattern TCP of the first test pattern TP1 and the conductive pattern TCP of the third test pattern TP3 may be formed of or include the same material as the electrode pattern SP2 (e.g., see FIG. 9B). The first region and the second region of the first insulating layer 221, which are different from each other, may correspond to the first insulating pattern IP1 of the first test pattern TP1 and the first insulating pattern IP1 of the second test pattern TP2. The second insulating layer 222 may include a first region and a second region, which are different from each other and correspond to the second insulating pattern IP2 of the first test pattern TP1 and the second insulating pattern IP2 of the second test pattern TP2. An opening 200-OP corresponding to the conductive pattern TCP of the third test pattern TP3 may be formed in the first insulating layer 221 and the second insulating layer 222.

An example, in which the conductive pattern TCP is formed of or includes the same material as the electrode pattern SP2 (e.g., see FIG. 9B), is illustrated in the present embodiment, but the inventive concept is not limited to this example. For example, the conductive pattern TCP may be formed of or include the same material as the first portion B1 of FIG. 9B.

In the present embodiment, a test region TPA may be further disposed in the vicinity of the test pattern TP. The test region TPA may be a region, on which the conductive pattern TCP, the first insulating pattern IP1, the second insulating pattern IP2, and the dummy pattern DMP are not disposed. The opening 200-OP corresponding to the test region TPA may be formed in the first insulating layer 221 and the second insulating layer 222.

The dummy pattern DMP may be disposed on the second insulating layer 222. An example, in which the dummy pattern DMP is formed of or includes the same material as the first portion B1 (e.g., see FIG. 9B), is illustrated in the present embodiment, but the inventive concept is not limited to this example. For example, the dummy pattern DMP may be disposed below the first insulating layer 221 and may be formed of or include the same material as the electrode pattern SP2 (e.g., see FIG. 9B).

As shown in FIG. 12B, images of the first to third test patterns TP1, TP2, and TP3 and the test region TPA may be detected. Based on the images of four different kinds, it is possible to examine whether there is a failure in the input sensor 220 and to determine at which step in a fabrication process such a failure occurred, in the manner described with reference to FIGS. 8A to 8E.

The inventive concept will now be described with reference to FIG. 12C. The description that follows will mainly refer to features that are different from those of the test pattern TP described with reference to FIGS. 12A to 12B.

As shown in FIG. 12C, the dummy pattern DMP and the conductive pattern TCP may be disposed on the same layer. The dummy pattern DMP may be formed of or include the same material as the conductive pattern TCP.

As shown in FIG. 12D, the first test pattern TP1 may include the conductive pattern TCP, the first insulating pattern IP1, and the second insulating pattern IP2, which are sequentially disposed on the top surface of the encapsulation substrate 210-U. The second test pattern TP2 may include the first insulating pattern IP1 and the second insulating pattern IP2, which are sequentially disposed on the top surface of the encapsulation substrate 210-U. The third test pattern TP3 may include the conductive pattern TCP disposed on the top surface of the encapsulation substrate 210-U.

In the present embodiment, the conductive patterns TCP of the first and third test pattern TP1 and TP3 may be formed of or include the same material as the electrode pattern SP2 of FIG. 9B. In the present embodiment, the conductive pattern TCP is described to include a material different from the dummy pattern DMP, but the inventive concept is not limited to this example. For example, the conductive pattern TCP may be formed of or include the same material as the dummy pattern DMP.

In an exemplary embodiment of the inventive concept, the conductive patterns TCP of the first and third test patterns TP1 and TP3 may be formed of or include the same material as the first portion B1 of FIG. 9B.

The first insulating patterns IP1 of the first and second test patterns TP1 and TP2 may be spaced apart from each other. The first insulating patterns IP1 of the first and second test patterns TP1 and TP2 may be formed of or include the same material as the first insulating layer 221 of FIG. 9B. The second insulating patterns IP2 of the first and second test patterns TP1 and TP2 may be spaced apart from each other. The second insulating patterns IP2 of the first and second test patterns TP1 and TP2 may be formed of or include the same material as the second insulating layer 222 of FIG. 9B. The first insulating layer 221 and the second insulating layer 222 may not be overlapped with the third test pattern TP3, the test region TPA, and the dummy pattern DMP.

Images of the first to third test patterns TP1, TP2, and TP3 and the test region TPA shown in FIG. 12C may be obtained, and in this case, based on the images of four different kinds, it is possible to examine whether there is a failure in the input sensor 220 and to determine at which step in a fabrication process such a failure occurred, in the manner described with reference to FIGS. 8A to 8E.

According to an exemplary embodiment of the inventive concept, it may be possible to examine whether there is a failure in an input sensor. Furthermore, it is possible to determine at which step in a fabrication process such a failure occurred. For example, it is possible to determine whether the failure occurred in a fabrication process of an input sensor or a fabrication process of a display device, based on a difference in light reflectance obtained from test patterns.

By etching a base substrate, it is also possible to fabricate a slim display device.

Exemplary embodiments of the inventive concept described above provide a display device capable of providing information on a process step causing a failure in its fabrication process.

Exemplary embodiments of the inventive concept described above provide a method of fabricating the display device.

While the present inventive concept has been described with reference to exemplary embodiments thereof, it will be understood by one of ordinary skill in the art that variations in form and detail may be made thereto without departing from the spirit and scope of the inventive concept as set forth in the attached claims.

What is claimed is:

1. A display device, comprising:
    a display panel; and
        an input sensor disposed on the display panel and comprising a sensing area and a test area outside the sensing area, the test area including a first test area, a second test area, and a third test area,
    wherein the input sensor comprises:
        sensing electrodes disposed in the sensing area;
        a first conductive pattern in the first test area;
        a second conductive pattern in the third test area;
        a first insulating layer overlapped with the first test area, the second test area, and the third test area; and
    a second insulating layer including a first opening corresponding to the third test area, overlapped with the first test area and the second test area, and disposed on the first insulating layer.

2. The display device of claim 1, wherein at least one of the first and second conductive patterns comprises a transparent metal oxide, and
    one of the sensing electrodes comprises an electrode pattern including a transparent metal oxide.

3. The display device of claim 1, wherein at least one of the first insulating layer and the second insulating layer further overlaps the sensing area.

4. The display device of claim 1, wherein the first conductive pattern is disposed between the first insulating layer and the second insulating layer.

5. The display device of claim 1, wherein the second conductive pattern is disposed on the first insulating layer.

6. The display device of claim 1, wherein the display panel comprises:
    a first substrate;
    a second substrate facing the first substrate;
    a circuit element layer disposed between the first substrate and the second substrate; and
    an emission element layer disposed on the circuit element layer.

7. The display device of claim 6, wherein a sensing electrode of the sensing electrodes and the first insulating layer are in contact with a top surface of the second substrate.

8. The display device of claim 1, wherein
    the sensing electrodes comprise a first sensing electrode and a second sensing electrode crossing the first sensing electrode.

9. The display device of claim 8, wherein the first sensing electrode comprises a bridge pattern, a portion of which is disposed below the first insulating layer, and an electrode pattern, which is disposed on the first insulating layer and is connected to the portion of the bridge pattern disposed below the first insulating layer through a penetration hole penetrating the first insulating layer.

10. The display device of claim 9, wherein the portion of the bridge pattern, which is disposed below the first insulating layer, comprises a metallic material, and
    the electrode pattern comprises a transparent conductive oxide.

11. The display device of claim 9, wherein the test area further comprises a fourth test area,
    the second insulating layer further includes a second opening corresponding to the fourth test area.

12. The display device of claim 8, wherein the first sensing electrode comprises an electrode pattern, which is disposed below the first insulating layer, and a bridge pattern, a portion of which is disposed on the first insulating layer, and which is connected to the electrode pattern through a penetration hole penetrating the first insulating layer.

13. The display device of claim 12, wherein the first conductive pattern is disposed below the first insulating layer.

14. The display device of claim 1, wherein the first conductive pattern is disposed below the first insulating layer.

15. The display device of claim 14, wherein the first insulating layer includes a second opening corresponding to the first opening, and
    the second conductive pattern is exposed from the first insulating layer and the second insulating layer.

16. The display device of claim 15, wherein the first conductive pattern and the second conductive pattern comprise a same material as each other.

17. The display device of claim 14, wherein the test area further comprises a fourth test area,
    the second insulating layer further includes a second opening corresponding to the fourth test area, and
    the first insulating layer further includes a third opening corresponding to the second opening.

18. The display device of claim 1, further comprising dummy patterns disposed in a vicinity of the test area, and
    the dummy patterns comprise a same material as at least one of the first and second conductive patterns.

19. The display device of claim 1, further comprising dummy patterns disposed near the test area,
    wherein the dummy patterns and at east one of the first and second conductive patterns are disposed on a same layer.

20. The display device of claim 1, further comprising dummy patterns disposed near the test area,
    wherein the dummy patterns and the first conductive patterns are disposed on a different layer from each other.

* * * * *